(12) United States Patent
Budd et al.

(10) Patent No.: US 7,003,702 B2
(45) Date of Patent: Feb. 21, 2006

(54) END-TO-END CHECKSUMMING FOR READ OPERATIONS

(75) Inventors: Robin Budd, Seattle, WA (US); Alexander Veprinsky, Brookline, MA (US); Arieh Don, Newton, MA (US)

(73) Assignee: EMC Corporation, Hopkinton, MA (US)

( * ) Notice: Subject to any disclaimer, the term of this patent is extended or adjusted under 35 U.S.C. 154(b) by 477 days.

(21) Appl. No.: 10/229,685

(22) Filed: Aug. 28, 2002

(65) Prior Publication Data
US 2003/0177435 A1 Sep. 18, 2003

Related U.S. Application Data

(63) Continuation-in-part of application No. 10/100,520, filed on Mar. 18, 2002.

(51) Int. Cl.
G06F 11/00 (2006.01)
(52) U.S. Cl. .............................. 714/52; 714/48; 714/54
(58) Field of Classification Search ..................... 714/6, 714/52, 54, 42, 48, 49, 764, 766, 776
See application file for complete search history.

(56) References Cited

U.S. PATENT DOCUMENTS 5,898,713 A * 4/1999 Melzer et al. .............. 714/807
6,182,267 B1 * 1/2001 Kidd et al. ................. 714/807
2003/0140299 A1 * 7/2003 Duncan et al. ............. 714/763
2004/0003316 A1 * 1/2004 Meng et al. ................. 714/13

OTHER PUBLICATIONS

Microsoft Computer Dictionary. Fifth Ed. Microsoft Press, 2002. p. 300.*
"KeAcquireSpinLock", Driver Development Kit (DDK), By Microsoft Corporation, 1 page.
"Inside Windows NT", Microsoft Press, Helen Custer, Foreword by David N. Cutler, pp. 232-234, 1993.
"Inside Windows 2000", By David Solomon, 1 page.

* cited by examiner

Primary Examiner—Nadeem Iqbal
Assistant Examiner—Timothy M. Bonura
(74) Attorney, Agent, or Firm—Muirhead and Saturnelli, LLC

(57) ABSTRACT

Described are techniques used in detection of a data corruption in a computer system in connection with read and write operations. For a write operation, a host issues a write request that includes a checksum value determined in accordance with data associated with the write request. The write request is received by a data storage system that performs data validation using the checksum. The host issues a vendor-defined write request operation that includes the checksum as a data field in the request packet sent to the data storage system. For a read operation, a host issues a read request and the data storage system determines a checksum value before servicing the read request. The checksum is validated at the top of the I/O stack on the host by the file system filter driver.

32 Claims, 28 Drawing Sheets

END-TO-END CHECKSUMMING FOR READ OPERATIONS

RELATED APPLICATIONS

This application is a continuation-in-part of U.S. patent application Ser. No. 10/100,520, filed Mar. 18, 2002, which is incorporated by reference herein.

BACKGROUND

1. Technical Field

This application generally relates to computer data storage, and more particularly to detection of data corruption in connection with computer data storage.

2. Description of Related Art

Computer systems may include different resources used by one or more host processors. Resources and host processors in a computer system may be interconnected by one or more communication connections. These resources may include, for example, data storage devices such as the Symmetrix™ family of data storage systems manufactured by EMC Corporation. These data storage systems may be coupled to one or more host processors and provide storage services to each host processor. An example data storage system may include one or more data storage devices, such as those of the Symmetrix™ family, that are connected together and may be used to provide common data storage for one or more host processors in a computer system.

A host processor may perform a variety of data processing tasks and operations using the data storage system. For example, a host processor may perform basic system I/O operations in connection with data requests, such as data read and write operations and also administrative tasks, such as data backup and mirroring operations.

Host processor systems may store and retrieve data using a storage device containing a plurality of host interface units, disk drives, and disk interface units. Such storage devices are provided, for example, by EMC Corporation of Hopkinton, Mass. and disclosed in U.S. Pat. No. 5,206,939 to Yanai et al., U.S. Pat. No. 5,778,394 to Galtzur et al., U.S. Pat. No. 5,845,147 to Vishlitzky et al., and U.S. Pat. No. 5,857,208 to Ofek. The host systems access the storage device through a plurality of channels provided therewith. Host systems provide data and access control information through the channels to the storage device and storage device provides data to the host systems also through the channels. The host systems do not address the disk drives of the storage device directly, but rather, access what appears to the host systems as a plurality of logical disk units. The logical disk units may or may not correspond to the actual disk drives. Allowing multiple host systems to access the single storage device unit allows the host systems to share data stored therein.

When a host performs a data operation, such as a read operation, using a data storage device, corruption of the data may occur at any one or more different processing points from when data that is read from a device is returned to a user application, for example, such as a high level user software application. The data corruption may not be detected until some time later, for example, when a subsequent attempt is made to access the corrupted data. Additionally, some applications may not be able to detect bad incoming data in connection with a read operation. Other applications may be able to detect bad incoming data, but may not be able to do such detection easily in an efficient manner.

It may be desirable to have efficient and timely detection of data corruption in connection with a read operation to limit further propagation of corrupted data. That is, a data corruption may be detected only after the corrupted data that has been read is further used by additional applications, such as when performing a backup operation of data files.

Thus, it may be desirous and advantageous to have an efficient technique which provides for detection of a data corruption in connection with a read operation in a timely manner.

SUMMARY OF THE INVENTION

In accordance with one aspect of the invention is a method executed in a computer system for detecting a data error associated with a data operation. A request is issued for a data operation in connection with a device. It is determined if the data operation is a read operation having checksumming enabled for a file associated with the read operation. A data packet is formed that includes a data command requesting data to be read and a checksum value for the data. The data packet is received at a target location. A single return data packet including the data and the checksum value is sent to the issuing host.

In accordance with another aspect of the invention is a computer program product that detects a data error associated with a data operation that includes: machine executable code that issues a request for a data operation in connection with a device; machine executable code that determines if said data operation is a read operation having checksumming enabled for a file associated with said read operation; machine executable code that forms a data packet that includes a data command requesting data to be read and a checksum value for said data; machine executable code that receives said data packet at a target location; and machine executable code that sends a single return data packet including said data and said checksum value to said issuing host.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
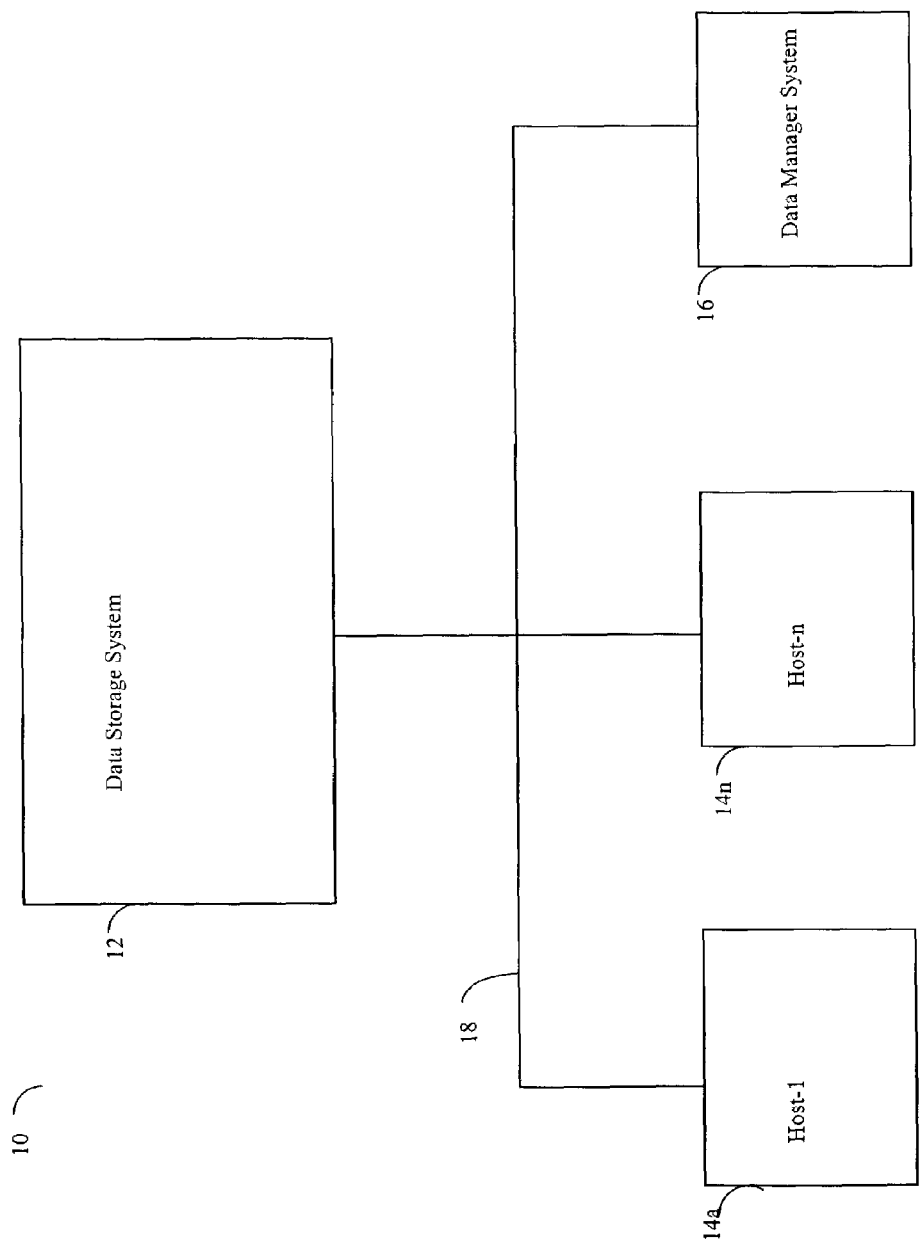
FIG. 1 is an example of an embodiment of a computer system according to the present invention.

Referring now to FIG. 1, shown is an example of an embodiment of a computer system according to the present invention. The computer system 10 includes a data storage system 12 connected to host systems 14a–14n and a data manager system 16 through communication medium 18. In this embodiment of the computer system 10, the N hosts 14a–14n and the data manager system 16 may access the data storage system 12, for example, in performing input/output (I/O) operations or data requests. The communication medium 18 may be any one of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network or other connection(s) by which the host systems 14a–14n and the data manager system may access and communicate with the data storage system 12, and may also communicate with others included in the computer system 10.

Each of the host systems 14a–14n the data manager system 16, and the data storage system 12 included in the computer system 10 may be connected to the communication medium 18 by any one of a variety of connections as may be provided and supported in accordance with the type of communication medium 18. The processors included in the host computer systems 14a–14n and the data manager system 16 may be any one of a variety of commercially available single or multi-processor system, such as an Intel-based processor, IBM mainframe or other type of commercially available processor able to support incoming traffic in accordance with each particular embodiment and application.

It should be noted that the particulars of the hardware and software included in each of the host systems 14a–14n and the data manager system 16, as well as those components that may be included in the data storage system 12 are described herein in more detail, and may vary with each particular embodiment. Each of the host computers 14a–14n as well as the data manager system 16, may all be located at the same physical site, or, alternatively, may also be located in different physical locations. Examples of the communication medium that may be used to provide the different types of connections between the host computer systems, the data manager system, and the data storage system of the computer system 10 may use a variety of different communication protocols such as SCSI(Small Computer System Interface), ESCON, Fibre Channel, or GIGE (Gigabit Ethernet), and the like. Some or all of the connections by which the hosts, data manager system 16 and data storage system 12 may be connected to the communication medium 18 may pass through other communication devices, such as a Connectrix or other switching equipment that may exist such as a phone line, a repeater, a multiplexer or even a satellite.

Each of the host computer systems as well as the data manager system may perform different types of data operations in accordance with different types of administrative tasks. In the embodiment of FIG. 1, any one of the host computers 14a–14n may issue a data request to the data storage system 12 to perform a data operation. For example, an application executing on one of the host computers 14a–14n may perform a backup, mirroring or other administrative operation and may do so while performing data requests to the data storage system 12.

Figure 2:
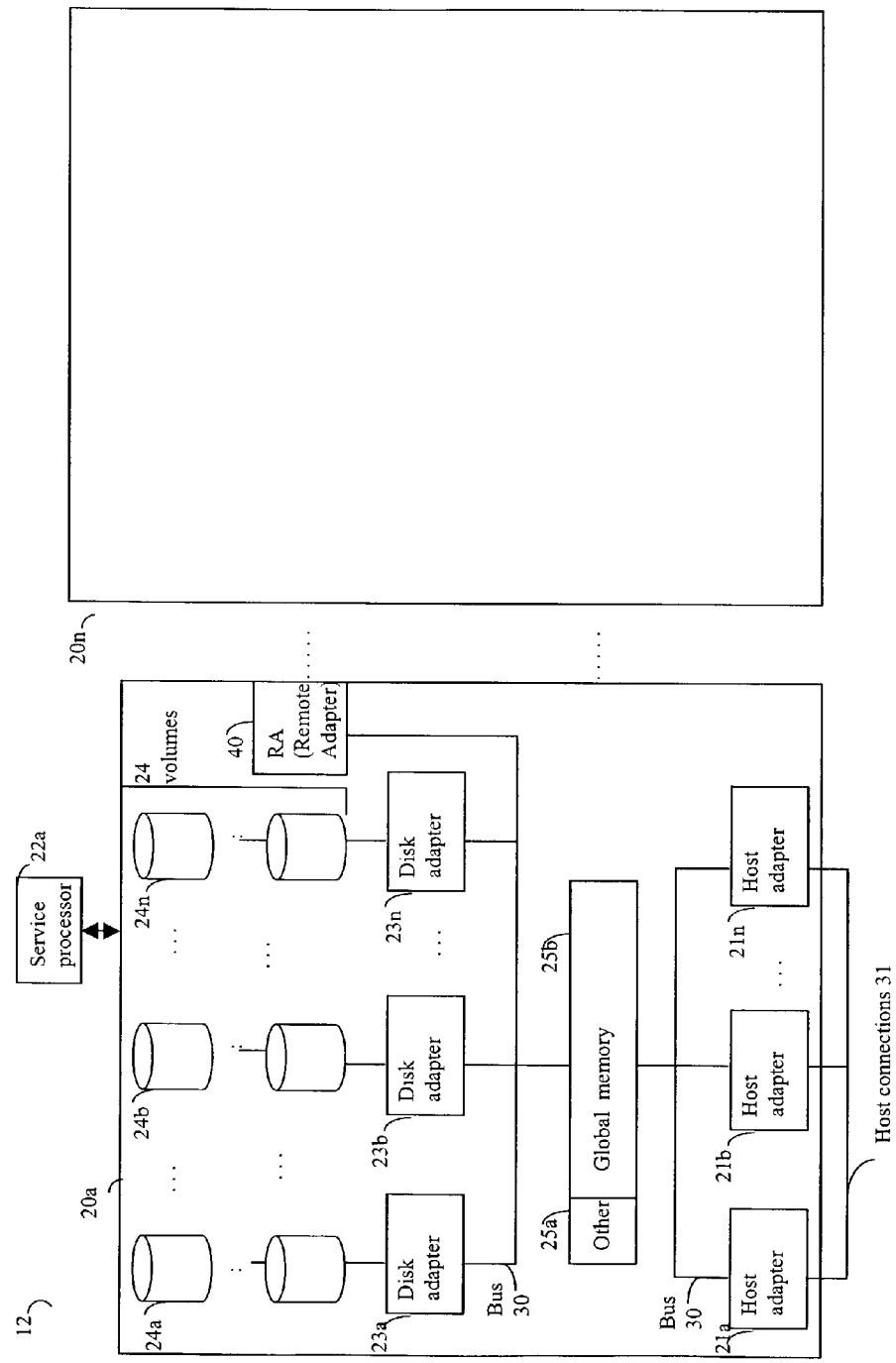
FIG. 2 is an example of an embodiment of a data storage system.

Referring now to FIG. 2, shown is an example of an embodiment of the data storage system 12 that may be included in the computer system 10 of FIG. 1. Included in the data storage system 12 of FIG. 2 are Symmetrix™ storage systems 20a–20n as manufactured by EMC Corporation of Hopkinton, Massachusetts. In this particular example, each of the Symmetrix™ storage systems 20a–20n may be inter-connected (not shown) as well as connected to the host and data manager systems through any one or more communication connections 30 that may vary with each particular embodiment and device in accordance with the different protocols used in a particular embodiment. Additionally, the type of communication connection used may vary with certain system parameters and requirements, such as those related to bandwidth and throughput required in accordance with a rate of I/O requests as may be issued by the host computer systems, for example, to the data storage system 12. In this example as described in more detail in following paragraphs, reference is made to the more detailed view of element 20a. It should be noted that a similar more detailed description may also apply to any one or more of the other elements, such as 20n, but have been omitted for simplicity of explanation. It should also be noted that an embodiment may include other types of data storage systems in combination with one or more Symmetrix™ systems. Each of 20a–20n may be resources included in an embodiment of the computer system 10 to provide storage services to, for example, host computer systems and/or the data manager system.

Each of the Symmetrix™ systems, such as 20a, may include a plurality of disk devices or volumes, such as the arrangement 24 consisting of n rows of disks or volumes 24a–24n. In this arrangement, each row of disks or volumes may be connected to a disk adapter ("DA") or director responsible for the backend management of operations to and from a portion of the disks or volumes 24. In the Symmetrix™ system 20a, a single DA, such as 23a, may be responsible for the management of a row of disks or volumes, such as row 24a. Each of the DAs 23a–23n are connected, for example, by a bus 30 to a cache that includes a particular portion designated as global memory 25b. The DAs 23a–23n may perform data operations to and from the cache that may be included in the global memory 25b, for example, in communications with other disk processors or directors, and other components of the system 20a. Generally, the global memory 25b may be used in facilitating communications between components in the system 20a. The other portion 25a is that portion of memory that may be used in connection with other designations that may vary in accordance with each embodiment.

An embodiment of the Symmetrix™ system 20a may include a service processor 22a used to manage and monitor the system 20a. In one embodiment, the service processor 22a may be used in collecting performance data, for example, regarding the I/O performance in connection with system 20a. This performance data may relate to, for example, performance measurements in connection with a data request as may be made from the different host computer systems 14a–14n. This performance data may be gathered and stored, for example, in the global memory and/or other storage area.

The system 20a may also include one or more host adapters ("HAs") or directors 21a–21n. Each of these HAs maybe used to manage communications and data operations between one or more host systems and the global memory.

The particular data storage system as described in this embodiment, such as a Symmetrix™ system by EMC Corporation or a disk, should not be construed as a limitation. Other types of commercially available data storage systems, as well as processors and hardware controlling access to these particular devices, may be also be included in an embodiment.

Also shown in the storage system 20a is an RA or remote adapter 40. The RA may be hardware including a processor used to facilitate communication between data storage systems, such as between two Symmetrix data storage systems. The RA may be used with the Remote Data Facility (RDF) product provided by EMC Corporation of Hopkinton, Mass.

Host systems provide data and access control information through channels to the storage systems, and the storage systems may also provide data to the host systems also through the channels. The host systems do not address the disk drives of the storage systems directly, but rather access to data may be provided to one or more host systems from what the host systems view as a plurality of logical devices or logical volumes (LVs). The LVs may or may not correspond to the actual disk drives. For example, one or more LVs may reside on a single physical disk drive. Data in a single storage system may be accessed by multiple hosts allowing the hosts to share the data residing therein. The HAs may be used in connection with communications between a Symmetrix data storage system and a host system. The RAs may be used in facilitating communications between two Symmetrix data storage systems. The DAs may be used in connection with facilitating communications to the associated disk drive(s) and LV(s) residing thereon.

The DA may cause I/O operations to be performed on a volume or device. In the following description, data may be accessed by LV in which a single DA manages data requests in connection with I/O operations in connection with multiple LVs that may reside on a disk. The DA may accomplish this by creating job records for the different LVs associated with the particular DA. These different job records may be associated with the different LVs in a data structure stored and managed by each DA.

Figure 3:
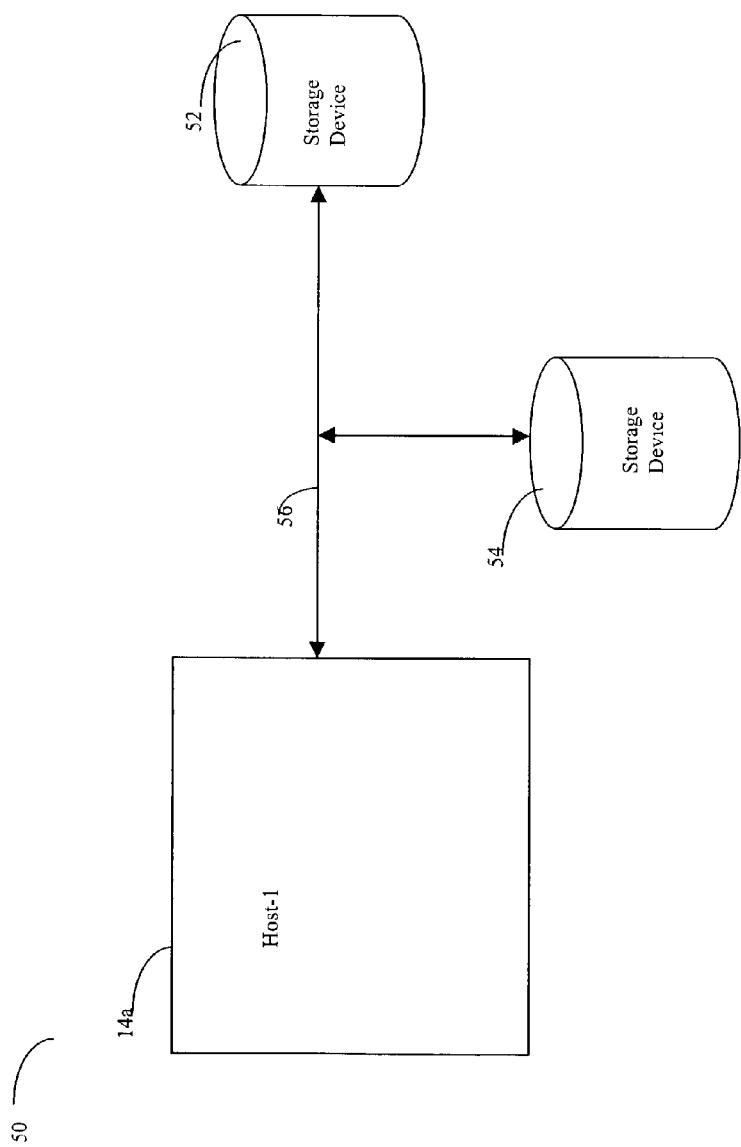
FIG. 3 is an example of an embodiment of a host performing I/O operations to a data storage device with a transaction log on another data storage device included in the system of FIG. 1.

Referring now to FIG. 3, shown is an example of an embodiment 50 of a host that may perform I/O operations, for example, in connection with a storage device that may be included in the data storage system 12 previously described herein. It should be noted that the illustration 50 includes particular components that may be included in an embodiment of the computer system 10 of FIG. 1. Other components may also exist, however, only those components used in connection with the following description are included for simplification.

A host computer system, such as host 14a, may perform an I/O request to a storage device, such as storage device 52. Additionally, as host computer system 14a performs the I/O operation to the storage device 52 over communication connection 56, information about the particular I/O operation may be recorded in a transaction log. The transaction log may be stored in another data storage device, such as storage device 54. It should be noted that the communication connection 56 used to facilitate communications between the host 14a and any one of or more of the data storage devices, such as 52 and 54, may be similar to the communication connection 18 previously described in connection with the system 10 of FIG. 1. The data storage devices 52 and 54 may be included in the data storage system 12 or at another location to which the host 14a is connected.

Figure 4:
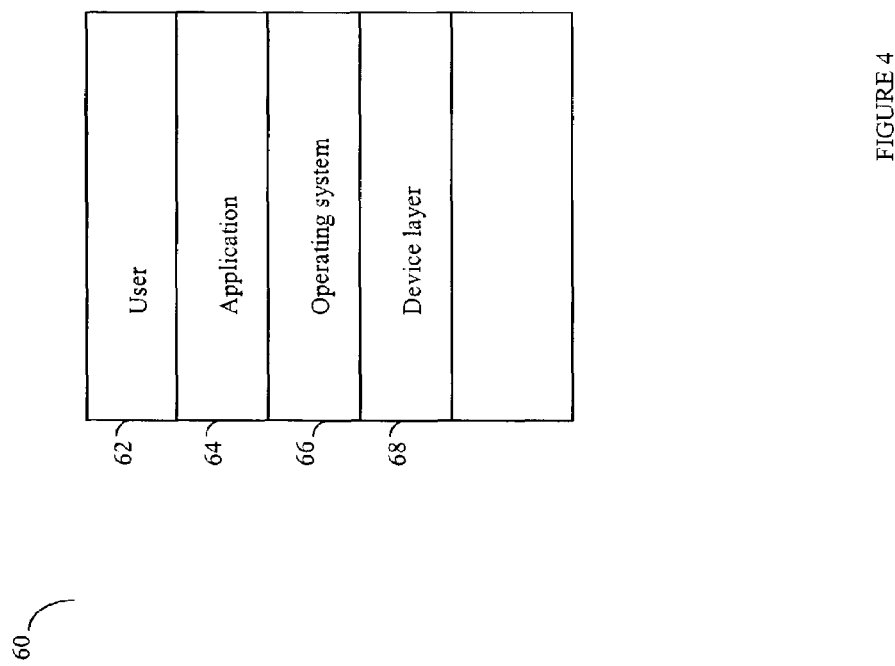
FIG. 4 is an example of software layers that may be included in an embodiment of the host computer system when making an I/O request.

Referring now to FIG. 4, shown is an example of an illustration of the different layers of software that may be used in an embodiment when performing an I/O request between the host and the data storage device 52. One or more drivers included in each layer may be used in connection with processing the I/O request.

As will be described herein, an embodiment of a host computer system may include the Windows NT™ operating system and associated software by Microsoft Corporation of Redmond, Wash. An embodiment may include other types of operating systems and associated software besides the Windows NT operating system as described herein. However, the principles and techniques described herein may be generally applied in accordance with each particular implementation and embodiment.

The Windows NT operating system includes performing I/O processing for file based devices or other requests using layered drivers as will be described with reference to 60 of FIG. 4. The illustration 60 of FIG. 4 includes a user layer 62, an application layer 64, an operating system layer 66, and device layer 68. It should be noted that other embodiments may include a different number and arrangement of layers and associated drivers than as shown in 60 of FIG. 4. Generally, the user software 62 may be characterized as a very high level user program making use of application software associated with the application layer 64. Application software 64 may include, for example, software that converts files for use with a particular database such as SQL. Generally, the application software 64 may be customized for a particular user and system. The application layer 64 may interface with different types of operating system software 66 to provide the files to the device layer 68. The device layer 68 includes drivers for different types of devices. Each of the drivers knows how a particular device operates and interfaces directly with such devices. Generally, the device driver and other device-specific software and operating system software may be bundled with a particular operating system such as a version of Microsoft Windows. The software associated with the layers 64 and 62, the application and user layers respectively, may be layered upon that which is included within the operating system.

An I/O request may be initiated by the user layer 62 and travel down through to the device layer 68 to the connection and subsequently communicated to one or more data storage devices using a communication connection, such as the connection 56 previously described herein.

It should be noted that as described herein, I/O requests may include basic operations such as a read operation, for example, in which a user may query a device to read data, or a write operation, for example, to input new data or overwrite existing data. The techniques described herein may be particularly useful in connection with processing write I/O requests.

Buffered and unbuffered I/O operations may be performed in an embodiment that includes the Windows NT operating system. In connection with buffered operations, information is copied to the kernel space buffer and cached. The file system does the caching of data by making a copy of the data from a buffer in kernel space. In connection with unbuffered I/O operations, the file system does no caching. For unbuffered I/O operations, there is a risk that the data buffer may be corrupted or written over since the data buffer is accessible to the application until the data is actually written out to the device. Therefore, the application and the driver may have access to the same portion of memory at the same time and one may overwrite the data without the other knowing. For this reason, an embodiment may rather use buffered I/O operations in connection with the NT operating system rather than using unbuffered I/O operations as described herein. However, there may be instances in which only unbuffered I/O operations may be performed increasing the likelihood of data corruption and thus the desire for timely and efficient data corruption detection.

Figure 5:
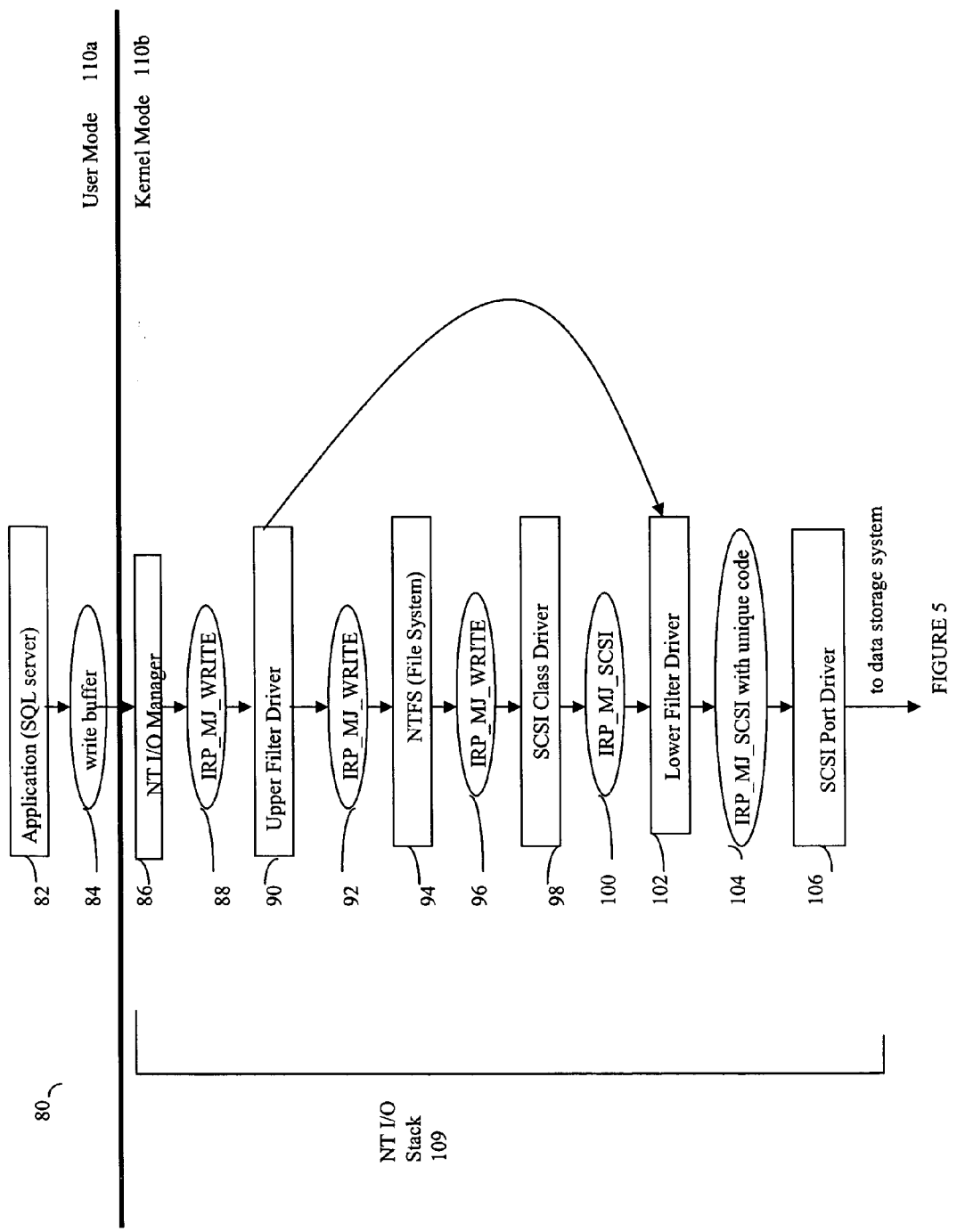
FIG. 5 is a more detailed diagram illustrating processing steps through different layers of software when making an I/O request.

Referring now to FIG. 5, shown is a more detailed example 80 of how an I/O request may be handled in connection with device drivers and other software associated with the different layers previously described and illustrated in FIG. 4. A user program (user level software) may issue an I/O request to an application 82 (application level). As previously described, this software 82 may be a portion of software associated with SQL used in connection with performing an I/O operation to an SQL database stored on a data storage device in the data storage system 12 of FIG. 1. In connection with the I/O operation, the application software 82 may create a data buffer, such as the write buffer 84, which is passed to the NT I/O manager 86.

The NT I/O manager 86 is an operating system component executing in kernel mode which receives the request and creates an I/O request packet (IRP) to represent the data in the write buffer 84. The IRP is a structure created and managed by the NT I/O manager to pass commands and data to kernel mode components and drivers. The NT I/O manager 86 creates an IRP which includes data for the write command, denoted as IRP_MJ_WRITE 88, which is passed to the upper filter driver 90. The upper filter driver, as well as the lower filter driver described in the following paragraphs, may perform additional processing on each of the IRPs as they are passed between drivers. In this example, the upper filter driver 90 checks to determine whether the particular write command is for a file that has checksumming enabled. This may be indicated, for example, by different types of metadata associated with a file that may be passed down to the upper filter driver. An example of the IRP data structure is described generally in more detail elsewhere herein. However, it should be noted that the IRP may be used to pass and communicate data as needed between different drivers.

If checksumming is enabled, the upper filter driver obtains the checksum. The checksum may be obtained in any one of a variety of different ways in accordance with a particular embodiment. For example, in one embodiment, the upper filter driver may calculate the checksum on the data associated with the particular I/O request. In another embodiment, the checksum may be passed to the upper filter driver 90 as part of the data associated with the IRP 88. The checksum may be calculated prior to the upper filter driver being called. For example, software associated with the SQL server as described in connection with the application software 82 may perform the checksum on the data being transferred in the associated I/O request and embed the checksum in the data buffer. In this instance, the upper filter driver may extract the previously calculated checksum from the data passed as an input data parameter in the IRP or through other means to the upper filter driver 90.

Having the application software 82 perform the checksum calculation may have advantages. For example, since the checksum is calculated before the buffer is actually submitted to the I/O system, such as to the NT I/O manager 86, if any corruption occurs between the time that the application software submits the buffer and the time that the upper filter sees the buffer, the corruption may be detected at this particular point by examining the checksum and the data. Additionally, the application software such as SQL may validate the checksum when it later reads the buffer from the disk, such as in connection with performing a read operation.

However the upper filter driver obtains the checksum, the upper filter driver uses an IRP identifier (IRP id) to form an index and sends the IRP identifier and the associated checksum to the lower filter driver 102. The IRP identifier is a number uniquely identifying a particular IRP as one for which checksumming has been enabled. In one embodiment, the IRP id may be a memory address of the IRP data structure. The upper filter driver calls the lower filter driver to store an indication of each particular IRP that has checksumming enabled. Subsequently, particular processing may be performed when the lower filter driver is called as part of the sequence of layers of drivers as described in more detail in paragraphs that follow.

An IRP index may be formed from the IRP identifier using any one of a variety of different techniques as known to those skilled in the art. For example, in one embodiment, the IRP index may be formed using the IRP identifier and using a hashing technique, such as a mathematical modulus, or MOD, function in which a remainder may be the associated IRP identifier. The IRP address may be divided by 1,000 where the remainder may be used as the IRP identifier. Other embodiments may choose a particular range of identifiers in accordance with a number of IRPs that may be included in an embodiment. A routine may be called from the upper filter driver 90 passing the IRP identifier and the checksum for use by the lower filter driver 102. The lower filter driver 102, or other invoked routine, may store the IRP identifier and checksum in a list or other data structure used to indicate which IRPs have checksumming enabled so that the lower filter driver 102 may subsequently perform special processing, which is described in more detail in following text.

Generally, the hashing techniques that may be used herein map an IRP id, IRP address in this instance, to an index. The range of the indices may be values between 0 and some number considerably smaller than the number of possible IRP addresses. This index produced using a hashing technique, such as the MOD function described elsewhere herein, may be an index into a data structure, such as an array. The particular hashing technique may sometimes map two input values (IRP ids) to the same index resulting in a hash collision as known to those of ordinary skill in the art. Any one of a variety of different resolution techniques may be used to resolve a hash collision including, for example, an open address hashing scheme or a closed address hashing scheme. For example, in one embodiment, a linked list of collisions for each particular index may be maintained. Each array index may actually be record that includes a collision count and a pointer to a linked list of collision entries.

Following below is a pseudo-code like representation of how a hash index may be formed in one embodiment from the IRP id which is an address or pointer to the IRP structure:

```
hash_index = (IRP id/8) modulo array_size
if(array[hash_index] already in use)
then
    increment (array[hash_index].collision_count)
    allocate structure from free pool & fill in members
    add structure to linked list of colliding structures for
        hash_index
end then
else
    array[hash_index] = current index and fill in appropriate fields
        for checksum, etc.
```

It should be noted that hash collisions in an embodiment may be relatively rare so the overhead of searching the associated linked lists is minimal. If this proves not to be the case in particular embodiments, different measures may be taken, such as adjusting the size of the table, changing the hashing scheme if the distribution is not uniform, and the like.

It should also be noted that in the foregoing, the IRP ID is divided by 8 before taking the modulus. In this example, since IRP IDs are addresses, they are always 8-byte aligned. If this division by 8 was not performed, then 7 out of every 8 slots in the array would never be used. Other embodiments may include different variations of the foregoing in accordance with each particular implementation.

The upper filter driver 90 then passes the IRP, including the IRP identifier, as an IRP_MJ_WRITE 92 to the NTFS or file system layer 94. It should be noted that in this particular example, the NTFS is the particular file system being used. However, another embodiment may use a different file system layer at this point in processing for a driver.

It should be noted that each of the drivers, such as the file system driver, perform a particular portion or division of labor of the tasks in connection with performing the I/O request. In this example, the labor or operations for processing an I/O request are divided among each of the different drivers described herein. The file system driver, such as the NTFS file system driver 94 may perform, for example, writing data at a specified byte off set within a file. Subsequently, the file system driver 94 may pass the IRP as an IRP_MJ_WRITE IRP 96 to the SCSI class driver 98.

In this example, the SCSI class driver 98 may also be characterized as a disk class driver. The disk driver may perform the mapping of a logical to a physical disk address such as translating a file relative byte off set into a disk relative byte off set. Additionally, the SCSI class driver which is an instance of the disk class driver may pass an IRP_MJ_SCSI 100 which is an IRP containing a standard SCSI command to the lower filter driver 102. Within the IRP_MJ_SCSI 100 is a SCSI request block (SRB) to perform an I/O operation in accordance with the SCSI protocol in this example. Generally, an SRB may be characterized as a structure containing a standard SCSI command request. An SRB encapsulates a command data block (CDB) which is a structure that includes a standard header and command related data for a SCSI command. As will be described in paragraphs that follow, the SCSI protocol provides for a vendor to define CDBs using vendor defined or unique commands.

Part of the data that is passed to the lower filter driver 102 from the SCSI class driver 98 as part of the IRP_MJ_SCSI 100 is the IRP identifier. If the IR' identifier that is passed from the SCSI class driver 98 to the lower filter driver 102 matches one that is stored on the list of IRP identifiers accessed by the lower filter driver, then special processing may be performed by the lower filter driver in accordance with the enablement of checksumming. The lower filter driver may accordingly change the code associated with the write command to the vendor unique code in a CDB that includes an additional field in the command block for the checksum as indicated in the IRP 104 as the IRP_MJ_SCSI with the unique vendor defined code. This vendor defined code may be, for example, a function code associated with a particular portion of the CDB indicating that a write operation is to be performed. Rather than use the function code associated with a standard SCSI write operation, for example, a function code may be associated with a vendor defined or unique operation. Otherwise, if the IRP identifier does not match an entry in the list of checksum IRP identifiers, the standard SCSI write command may be used.

The IRP 104 containing the CDB with the unique command or the standard write command may then be passed to the SCSI port driver 106 for further forwarding to the data storage system. Micro code within a Symmetrix data storage system, for example, as shown in connection with FIG. 2, may validate the checksum in accordance with data of the I/O request. If an error is detected, for example, such that the checksum does not match in accordance with the data, an error code may be generated prior to the write being complete. Upon detection of validation failure, the write request may also fail and the host system may be provided with immediate feedback prior to the write being complete that the buffer or data was somehow corrupted.

Figure 6:
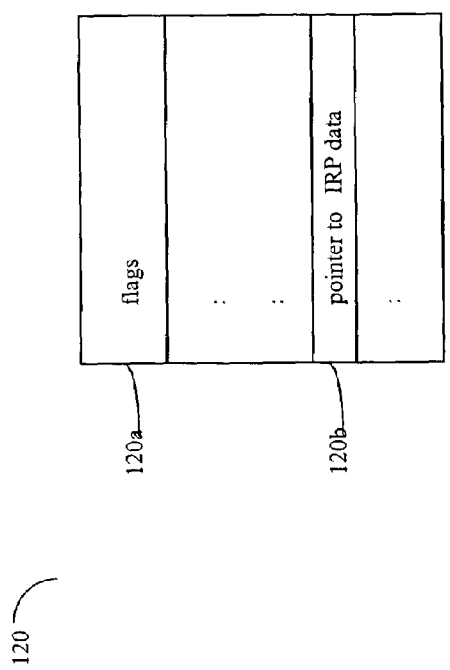
FIG. 6 is an example of an embodiment of an I/O request packet (IRP)

Referring now to FIG. 6, shown is an example of an embodiment of an IRP data structure. The I/O request packet or IRP 120 is a structure that may be created by the I/O manager and used to pass commands and data to the kernel mode components and drivers. Generally, an IRP 120 may include pointers to access the actual data and other information about the actual data associated with a request. For example, the IR 120 may include a pointer 120b to the actual user data, such as a data buffer, and other information in a flag field 120a about the associated data. The flag field 120a may include information such as the type and size of the request, whether the request is synchronous or asynchronous, and the like. The pointer 120b may be a pointer to a buffer for buffered I/O. The IRP data structure 120 may include the foregoing data, or pointer to data, and other information for use by the driver to which it is being passed. The IRP structure 120 may also include, for example, a function code, function specific parameters, a pointer to a file object and the like.

Figure 7:
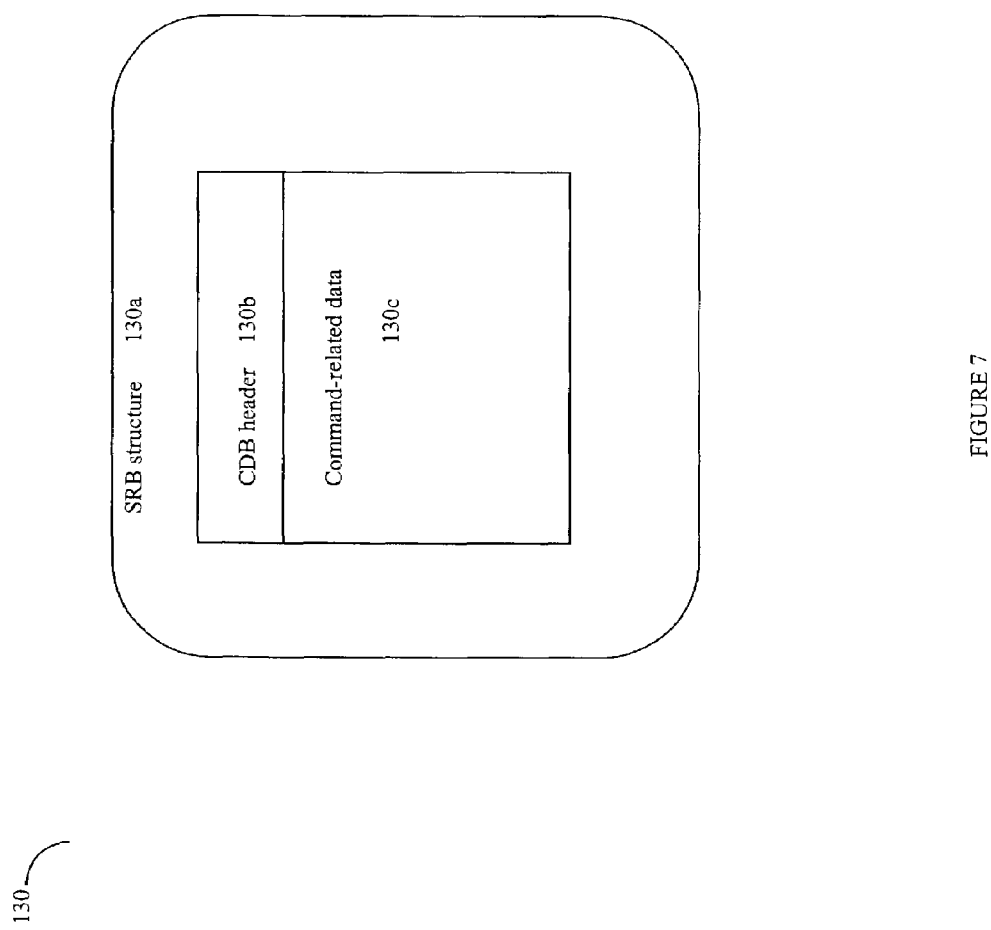
FIG. 7 is an example of an embodiment of a command data block (CDB) and its relation to the SCSI request block (SRB) as may be used in connection with issuing an I/O request in the system of FIG. 1.

Referring now to FIG. 7, shown is an example of a representation 130 illustrating a relationship between a CDB and an SRB. In this example, in accordance with the SCSI standard, a CDB may include a CDB header 130b and other command related data 130c. Generally, as described herein, a command data block or CDB may be characterized as a structure including a standard header 130b and command related data for a SCSI defined command 130c. The SCSI protocol allows vendors to also define their own CDBs for vendor unique or vendor defined commands. In this instance, the command related data, for example, may vary in accordance with a particular vendor defined command. When using a vendor defined write command as in this example when checksumming is enabled, the associated function code may be a vendor defined function code as opposed to, for example, a standard SCSI command function code.

An SRB 130a may be characterized as a structure containing a standard SCSI command request. The SRB may encapsulate a CDB as described herein. The SRB 130a may be that which is passed to particular data storage system, for example, when processing a standard SCSI command or a vendor defined unique command.

It should be noted that the micro code included in a portion of the data storage system, such as the Symmetrix data storage system may be included in, for example, a host adapter such as 21a or other data storage system component in performing the checksum validation processing. The techniques described herein in connection with checksum processing may be performed by any storage system having a microprocessor that may, for example, execute instructions in an implementation of the checksum techniques.

As described herein with the Windows NT operating system, a filter driver may generally be characterized as a kernel mode device driver attaching above or below another driver. The upper and lower filter drivers perform additional processing on various IRPs as they are passed between drivers. The NT I/O manager is a kernel mode component of the Windows NT operating system that manages I/O operations to and from all devices and all kernel mode drivers.

As shown in FIG. 5, the Windows NT operating system includes user mode 110a and a kernel mode 110b. Software included in the application layer 64 and user layer 62 of FIG. 4 may execute in the user mode 110a, for example, as shown with reference to the application 82 in user mode 110a. The application 82 may make I/O requests to the I/O manager and other components of the operating system and drivers that execute in kernel mode 110b.

Figure 8:
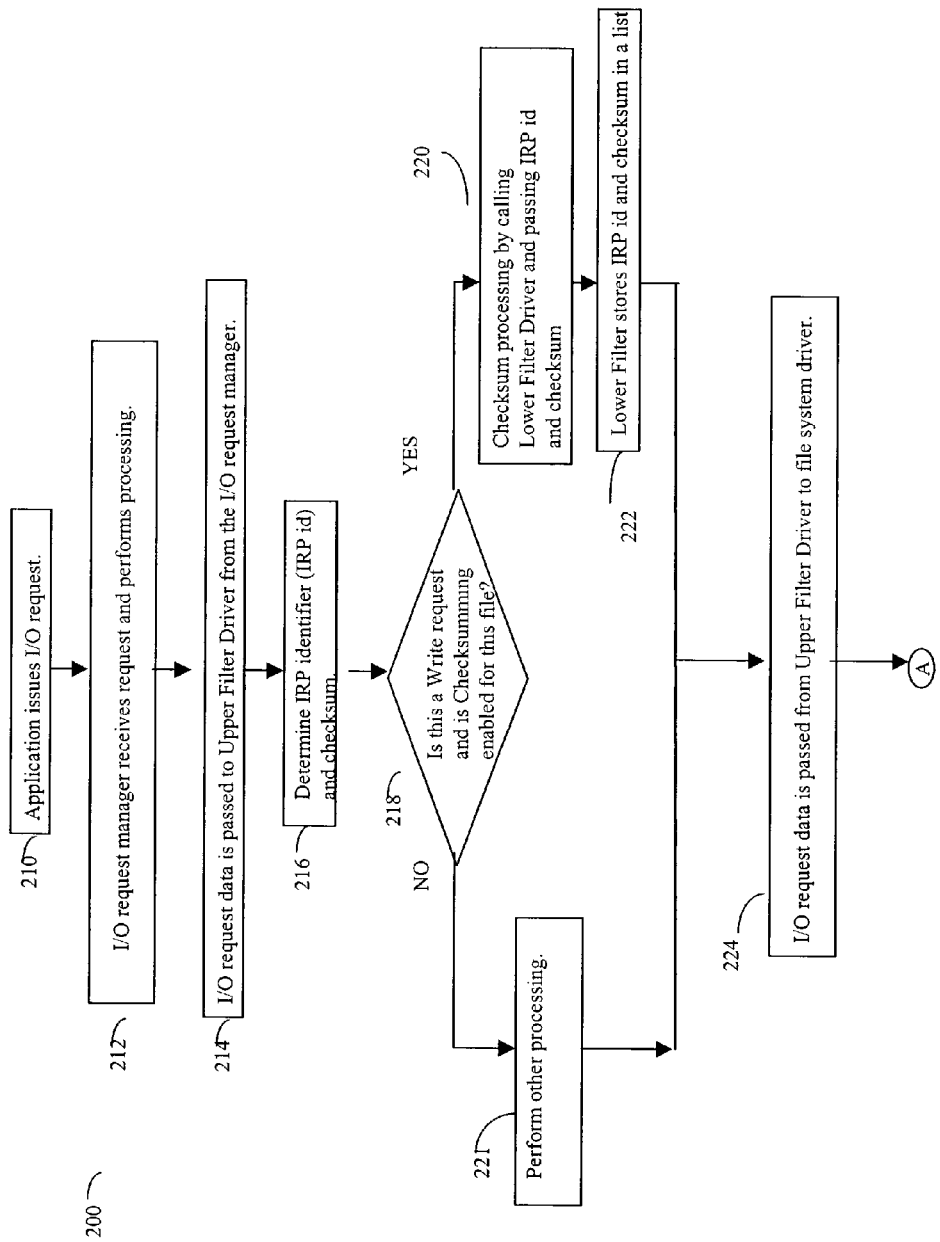
FIGS. 8-9 are steps of an embodiment in a flowchart for issuing an I/O request by a host computer system within the system of FIG. 1.
Figure 9:
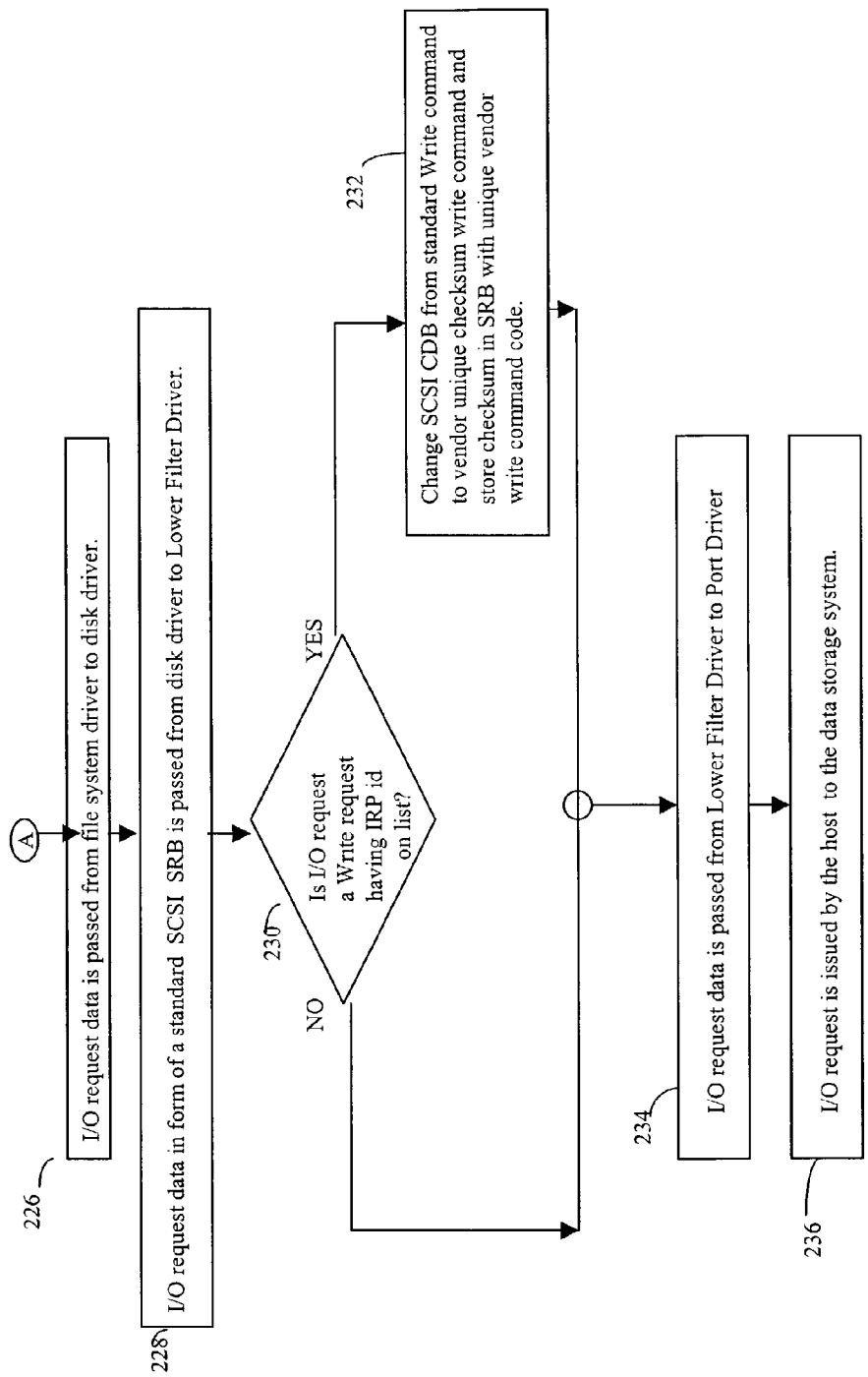

Referring now to FIGS. 8 and 9, shown are steps of an embodiment included in a flowchart that may be used in processing an I/O request. In particular, the method steps that will be described in connection with flowchart 200 of FIGS. 8 and 9 are a summary of processing steps previously described in connection with FIG. 5 and the software functionality described therein. At step 210, an application issues an I/O request. An I/O request, for example, may be initially issued by a user program to other application software such as in connection with storing files in a particular database, such as an SQL database. Subsequently, the application software such as the SQL software, may issue an I/O request at step 210 which is received by the I/O request manager executing in kernel mode at step 212. As part of the processing of step 212, the I/O request manager may perform I/O request processing including, for example, allocating storage and initializing the IRP. At step 214, the I/O request data is passed from the I/O request manager to the upper filter driver. The upper filter driver at step 216 determines the IRP identifier and checksum associated with this particular I/O request.

At step 218, it is determined if this particular I/O request is a write request and if checksumming is enabled for this particular file associated with the write request. If so, control proceeds to step 220 where checksum processing may be performed by calling the lower filter driver passing the IRP identifier and the checksum. At step 222, the lower filter driver stores the IRP identifier in a list. As described elsewhere herein, in one embodiment, this list may be an array in which the IRP identifier is hashed to yield an array index where the IRP identifier and checksum are stored. It should be noted that an embodiment may perform the processing associated with steps 220 and 222 for example, using any one of a variety of different techniques. In one embodiment, the upper level filter driver may pass information to the lower filter driver using a call back technique where the upper level filter driver calls a particular function that returns data in the form of parameters to the low level filter driver.

The particular call back technique that may be included for use in one embodiment will now be described in more detail. Upon initialization, the upper filter driver may communicate with the lower filter driver by sending a first custom I/O control (IOCTL) call. Included in this first call is a buffer, provided by the upper filter driver, where the lower filter driver may store the address of a call back routine in the lower filter driver. When the upper filter driver subsequently needs to notify the lower filter driver of the IRP address and checksum information, the upper filter driver does so by calling the lower filter's call back routine. An embodiment may use such a call back technique for speed and efficiency.

The checksum may also be determined using any one of a variety of different techniques. The upper filter driver itself may determine the checksum or, alternatively, the upper filter driver may be passed the checksum value previously calculated by another routine. This is described in more detail also herein. It should be noted that upon a determination that this particular I/O request is not a write request or that checksumming is not enabled, control may proceed to step 221 where other processing may be performed.

Control proceeds to step 224 where the I/O request data in the form of an IRP may be passed from the upper filter to the file system driver where the file system driver performs processing. Control proceeds to step 226 where the I/O request data may be passed from the files system driver to the disk driver. At step 228, the I/O request data may be passed to the lower filter driver in the form of a standard SCSI SRB. At step 230, the lower filter driver performs processing by making a determination as to whether the I/O request is a write request having an IRP identifier stored in the checksum list. If so, control proceeds to step 232 where the SCSI CDB is modified from a standard SCSI write command to a SCSI command for a vendor unique checksum write command. In this example, the modifications may include storing the checksum within the SRB and modifying a command or function code within the SRB to be that associated with the vendor unique command rather than the standard SCSI write command.

Control proceeds to step 234 where the I/O request data is passed from the lower filter driver to the port driver and, subsequently, the I/O request at step 236 is issued by the host to the data storage system.

Figure 10:
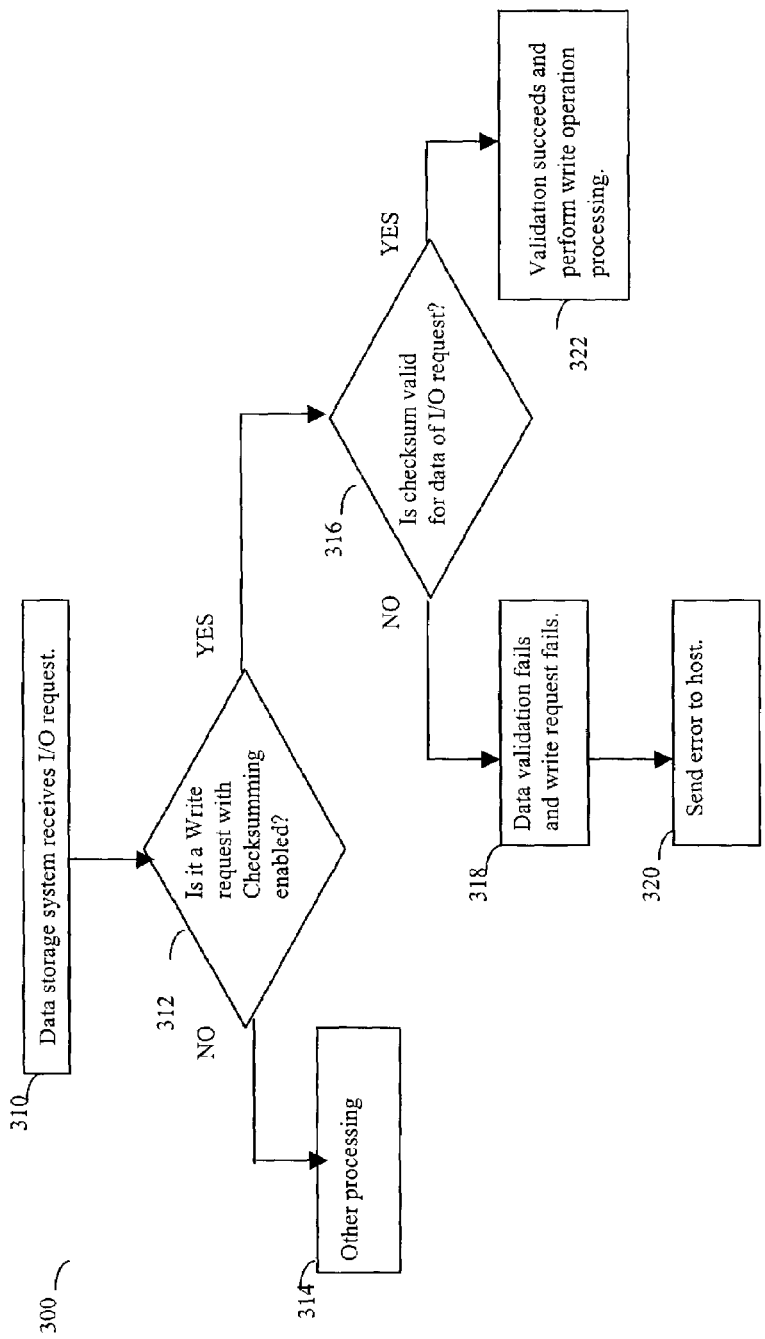
FIG. 10 are steps of an embodiment in a flowchart for processing an I/O request received by a data storage system within the system of FIG. 1.

Referring now to FIG. 10, shown are processing steps of a flowchart 300 that may be performed by a data storage system upon receiving an I/O request. At step 310, the data storage system receives the I/O request and performs processing to classify the I/O request. At step 312, a determination is made as to whether the I/O request is a write request with checksumming enabled. If not, control proceeds to step 314 where other processing may be performed in accordance with the particular type of I/O request. Otherwise, control proceeds to step 316 where a determination is made if the checksum is valid for data associated with the I/O request. If so, control proceeds to step 322 where an indication is made that the validation has succeeded and subsequently the write operation processing steps may be performed. Otherwise, at step 316 if a determination is made that the checksum is not valid in accordance with a particular data of the I/O request, control proceeds to step 318 where an indication is made that the data validation has failed and the write request has also failed. It should be noted that an embodiment may choose to not perform the actual writing of the data out to the device. Alternatively, an embodiment may perform the writing of the corrupt data and indicate that a checksum error has occurred. At step 320, an error is sent to the host in accordance with step 318 processing. For example, the host may be sent a message indicating that the write request has failed in accordance with the checksum data validation failure.

In one embodiment, the SCSI protocol allows for the target, such as a Symmetrix storage system, of a SCSI command to return a status code indicating the success or failure of an action. A unique status code associated with the unique vendor-defined SCSI command may be used indicating that a write operation has failed due to a checksum validation failure. The lower filter driver may convert the received status code into a special code provided by the operating system and the special code is further passed back up the call chain to the invoking application.

The host application, upon seeing that the write operation has failed the checksum test may perform any one of a variety of different actions. For example, the host may retry the write operation or choose to halt the write operation until the source of the problem has been identified and/or corrected. In either instance, using processing just described, the host has been notified of a data corruption upon its occurrence rather than, for example, upon a subsequent read operation performed sometime later following the write operation of the corrupted data.

The foregoing description sets forth processing steps and figures in connection with forming a single checksum for a single data buffer. In some embodiments, a write buffer associated with a write I/O request may be fragmented by a file system, such as the NTFS file system 94 as described in connection with FIG. 5. A single write buffer 88 may be used as input to the upper filter driver. However the file system 94 may apportion the original write buffer into a plurality of smaller data buffers each associated with an IRP. Collectively, all the newly produced IRPs associated with the smaller data buffers may represent the original data buffer associated with the write I/O request.

The file system may fragment a data buffer depending on where different portions of the data included in the original write buffer may be physically located on one or more devices. For example, initially a file may be created a certain size. As data is added to the file, the file may increase in size. The file system stores these additional portions associated with the same file at various locations that may be physically at different locations within the same device or on different physical devices. When this occurs, a write operation associated with a single logical file may result in actually writing different portions of the data buffer to different physical locations on one or more different devices. In connection with this processing, the file system 94 may divide a data buffer up into one or more smaller buffers corresponding to the different physical locations associated with a particular logical file.

If fragmentation is performed by the file system such as the NTFS file system 94, a plurality of smaller buffers may be output from the file system. In order to properly perform the checksumming if fragmentation has occurred, the upper filter driver may perform different processing than as described previously herein.

Figure 11:
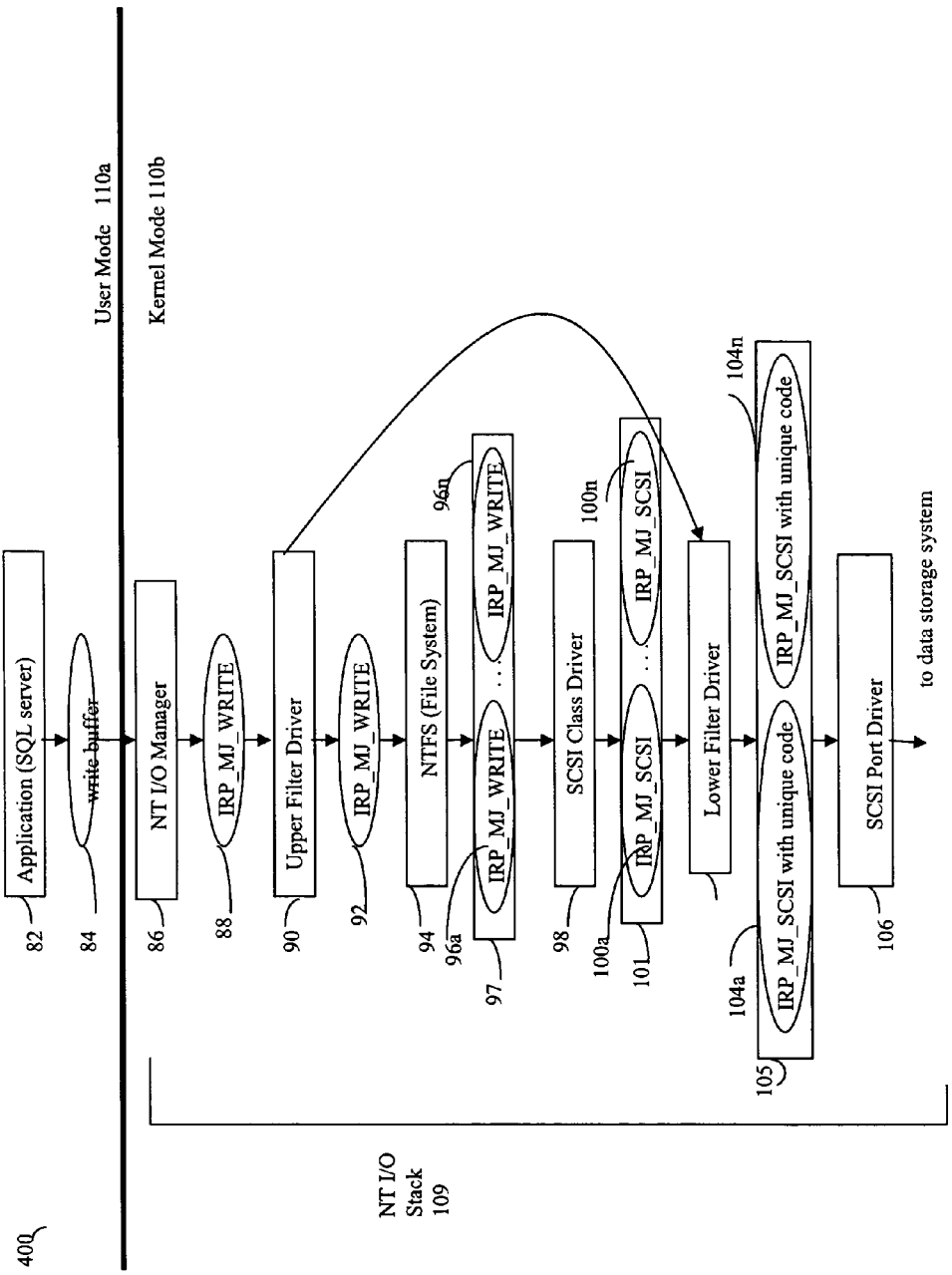
FIG. 11 is a detailed diagram illustrating processing steps through different driver layers in connection with an I/O request.

Referring now to FIG. 11, shown is a detailed diagram illustrating processing steps through different layers of software when making an I/O request in a system which includes fragmentation. Many of the elements included in FIG. 11 are similar to those as numbered and previously described in connection with FIG. 5. However, note that one of the differences occurs as an output of the file system 94 where a plurality of IRPs 97 may be produced, which are denoted 96a–96n. Similarly, a plurality of corresponding IRPs 101, denoted 100a–110n, are output by the SCSI class driver. Additionally, as an output of the lower filter driver, shown are a plurality of IRPs 105, denoted 104a–104n, each including the unique vendor defined function code, for example, in connection with a write operation when checksumming is enabled as previously described herein. Thus, the difference between the illustration of FIG. 11 and FIG. 5 is that the single input write buffer 84 has been fragmented into a plurality of smaller data buffers denoted at different points in the layering process such as at 97, 101 and 105.

Figure 12:
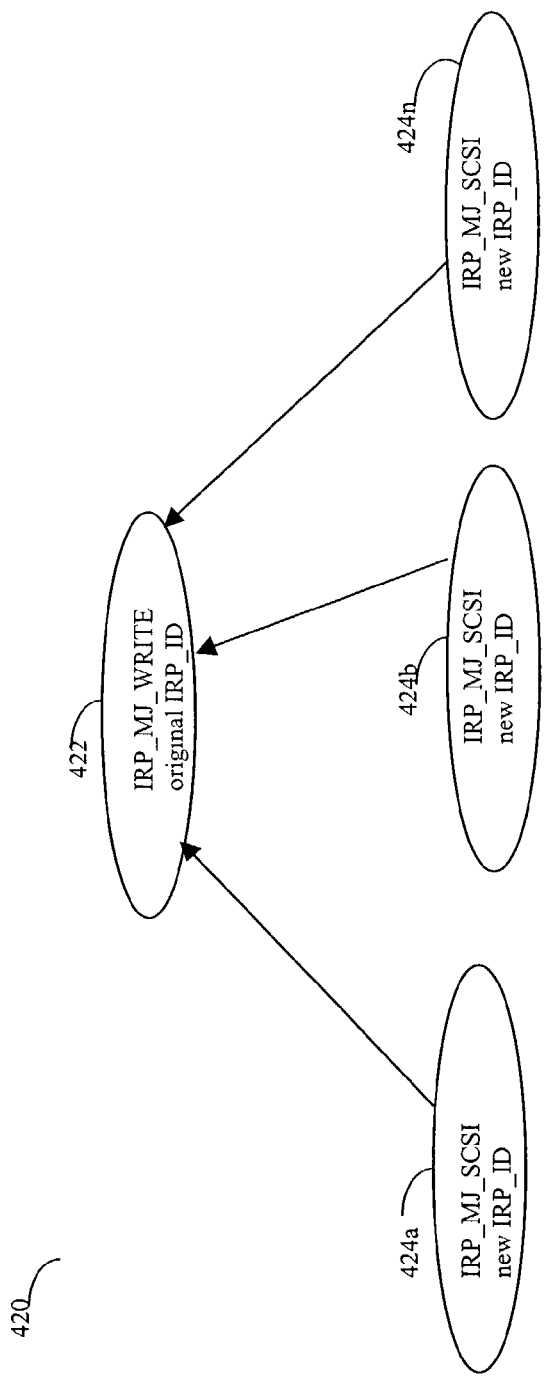
FIG. 12 is an example of a representation of the relationship between smaller fragmented buffers and an original write buffer.

Referring now to FIG. 12, shown is an example of a representation of the relationship between smaller fragmented buffers and an original write buffer. Shown in FIG. 12 is a relationship 420 between different IRPs that include the SCSI commands and associated fragment data buffer, and the original write buffer. Each of the smaller fragmented buffers denoted 424a–424n includes a pointer or identifier denoting the original write data buffer.

The IRP id associated with the original write data buffer 422 may be referred to also as a parent IRP id. Each of the smaller fragmented data buffers 424a–424n may each include their own IRP id and may also be referred to as child IRP ids denoting the relationship between each of the smaller fragmented buffers and the original write data buffer 422.

In an embodiment in which fragmentation of a data buffer is possible, the processing performed by the upper filter driver in connection with forming a checksum, such as in connection with processing at step 216 of FIG. 8, may include determining a plurality of checksums in accordance with the original write data buffer. In one embodiment, the data buffer may be divided into a plurality of smaller portions and a checksum may be determined for each of the portions. The upper filter may divide the entire data buffer into a plurality of pieces in which each piece is the smallest size possible or accessible in accordance with the minimum buffer size limits of the system. For example, a buffer that is 100 K bytes in length may be divided into 10 pieces such that each piece represents a 10 Kbyte chunk. The 10 K byte chunk may be the smallest or minimum size which may be output by the file system, for example, in connection with fragmentation. The upper filter driver may then perform a checksum on the data included in each of the small pieces. The upper filter driver may then pass the IRP id and each of the plurality of checksums associated with the different small pieces to the lower filter driver.

Additionally, the upper filter driver may either pass a byte range mapping to the lower filter identifying which checksum corresponds to what particular bytes of data of the original data buffer. Alternatively, the upper and lower filter driver may have an understanding rather than pass a byte range mapping, for example, as a parameter, such that the lower filter driver knows that a checksum corresponds to a particular byte range.

Figure 13:
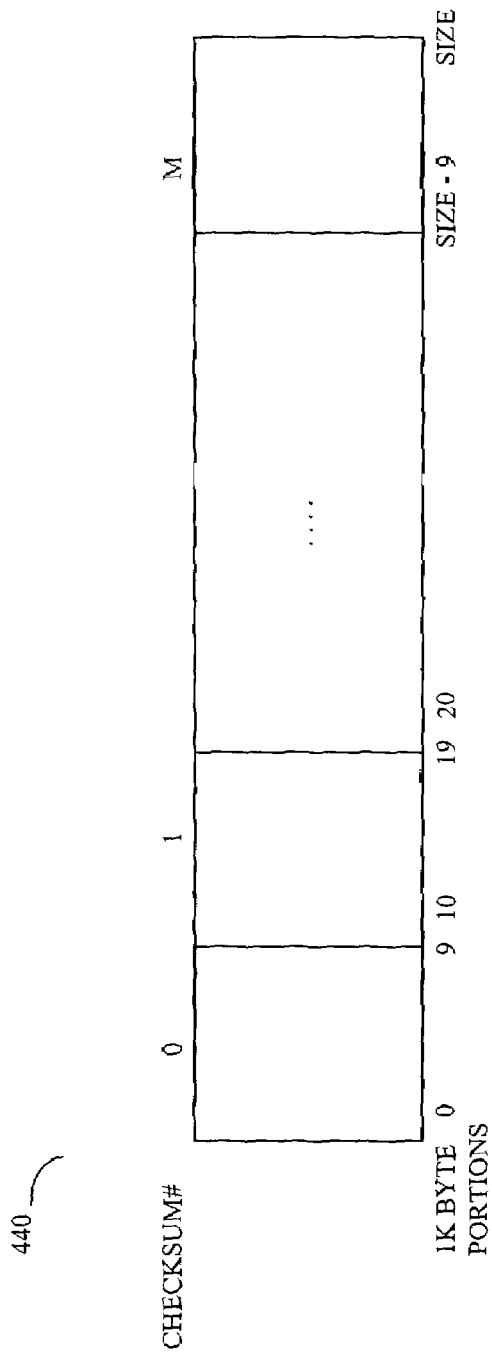
FIG. 13 is an example of a mapping of data buffer bytes to checksum values.

Referring now to FIG. 13, shown is a representation 440 of how particular bytes of a data buffer may correspond to a checksum in referring to the 100 K byte example just described. A data buffer has an associated plurality of checksums denoted 0 through M corresponding to 10 K byte portions. The data buffer consists of a SIZE number of 1 K byte portions. The information included in the representation 440 may also be referred to as a checksum byte range mapping of the original write data buffer. The information included in the representation 440 may be passed, for example, from the upper filter to the lower filter as a parameter or through other mechanisms known to those skilled in the art. Alternatively, as also described herein, the information of the representation 440 may be understood by both the upper and lower filter such that there is only one representation possible of mapping data buffer bytes to a particular checksum, for example, in accordance with multiples of the smallest possible fragment allowable within the system. This checksum byte range mapping may be used by the lower filter driver in determining the checksums for a particular data portion of the data buffer. It should be noted that an embodiment may have different fragment sizes, for example, such as determining a checksum for each 4 K block or portion rather than each 10 K portion.

Referring back to FIG. 11, it should be noted that each of the smaller fragments or pieces corresponding to a portion of the original data buffer may be output one at a time, for example, as passed between the different layers of the NT I/O stack 109. In other words, it is not that a single output 97 is produced simultaneously from the NTFS file system that includes all of the smaller buffers. Rather, an embodiment may include a file system that, subsequent to fragmenting a write data buffer, may output each of the different child IRPs one at a time passing it to the lower driver layers. The lower filter driver 102 may receive each of the fragmented IRPs one at a time rather than in a batched form. In this instance, the lower filter driver 102 may perform some bookkeeping to keep track of what fragments of an original write data buffer have passed to the lower filter driver.

Figure 14:
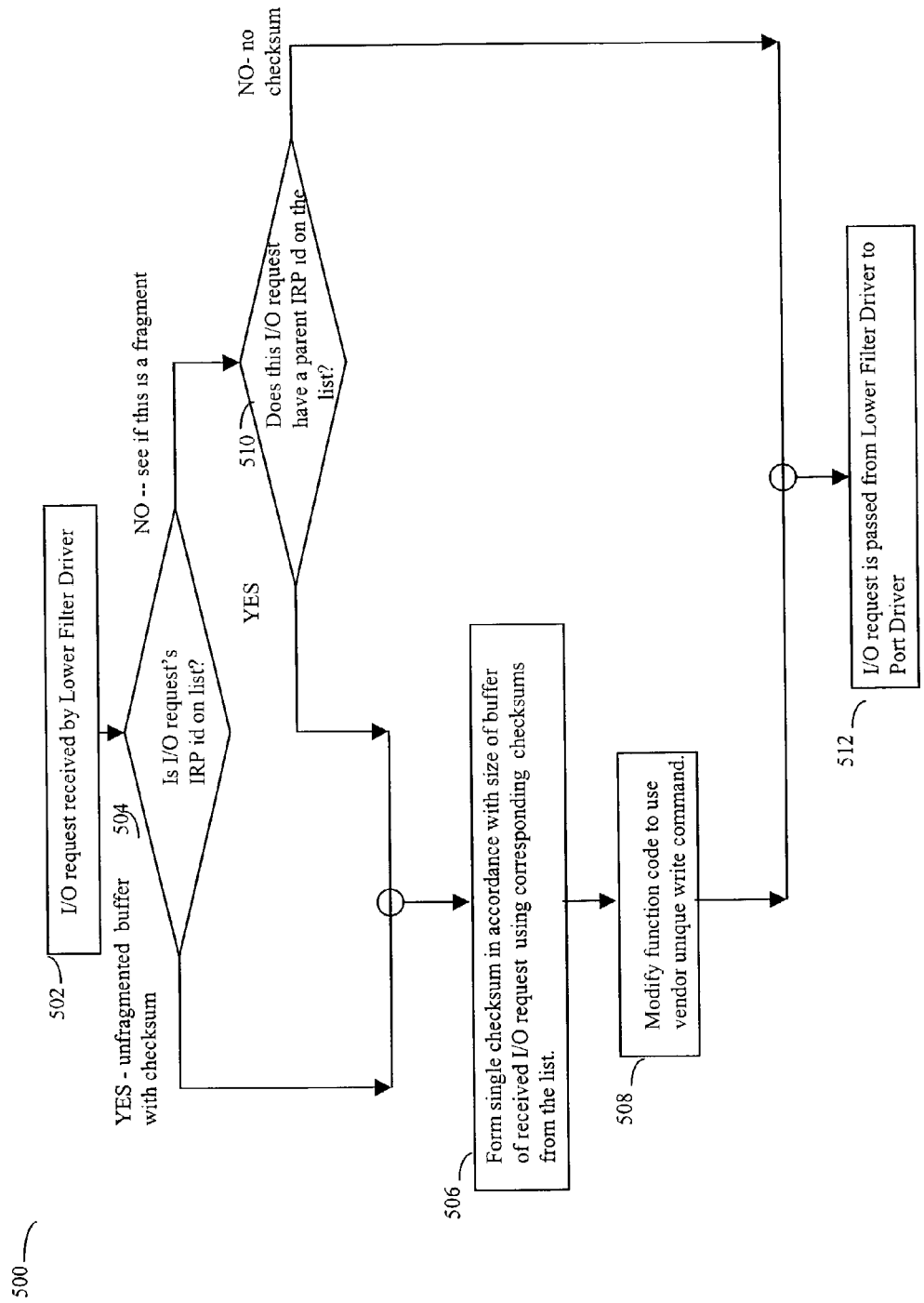
FIG. 14 is a flowchart of processing steps that may be performed by the lower filter driver in an embodiment that may include fragmentation of the original I/O data buffer.

Referring now to FIG. 14, shown is a flowchart 500 of processing steps that may be performed by the lower filter driver in an embodiment that may include fragmentation. It should be noted that the processing steps of flowchart 500 of FIG. 14 may be performed in place of other processing steps previously described in connection with FIG. 9 as may be performed by the lower filter driver.

At step 502, the I/O request may be received by the lower filter driver. At step 504, a determination is made as to whether the I/O request which has been received includes an IRP id which is on the list of those IRPs enabled for checksumming in accordance with information previously passed from the upper filter driver. If a determination is made at step 504 that the I/O request's IRP id is on the list indicating that checksumming has been enabled, control proceeds from step 504 to step 506 indicating that the I/O request is an unfragmented original buffer and associated request. At step 506, a single checksum is formed using corresponding checksums stored on the list of partial checksums passed from the upper filter driver. The single checksum formed is in accordance with the size of the entire buffer, since this is the size of the received I/O request's buffer. The single checksum may be performed, for example, by performing a logical exclusive-OR (XOR) operation of different checksums corresponding to the different portions of the buffer, for example, as described previously in connection with FIG. 13. At step 508, the function code may be modified to use the vendor unique defined write command with a checksum. Control then proceeds to step 512 where the I/O request is passed from the lower filter driver to the port driver.

At step 504, if a determination is made that the I/O request's IRP id is not on the list, control proceeds to step 510 where a determination is made as to whether the I/O request has a parent IRP id which is on the list. If a determination is made at step 510 that the I/O request has a parent IRP id which is on the list, control proceeds to step 506. Otherwise, control proceeds from step 510 directly to step 512 because it has been determined that checksumming has not been enabled for either an unfragmented buffer, or a fragmented portion of an original write data buffer.

If it has been determined that either an unfragmented buffer has been received, or that the I/O request received corresponds to a fragment or portion of an original data buffer, a single checksum is formed corresponding to the size of the data buffer of the received I/O request using the plurality of checksums previously received from the upper filter driver. The single checksum may be formed, for example, by performing a logical exclusive OR operation of the different checksums corresponding to smaller pieces of the data buffer.

Figure 15:
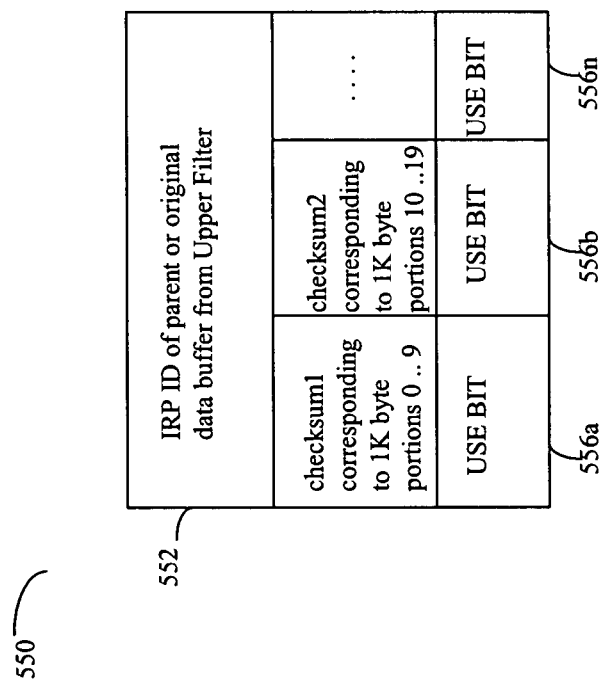
FIG. 15 is an example of an embodiment of a data structure record used to track information in connection with a write request with checksumming enabled as used by the upper and lower filters.

Referring now to FIG. 15, shown is an example of an embodiment of a record that may be created for each set of information passed from the upper filter to the lower filter driver upon the upper filter driver determining that checksumming has been enabled for a data buffer. As previously described in connection with an embodiment that may include fragmentation of an original data buffer, the upper filter driver may pass to the lower filter driver in the IRP id of the parent or the original data buffer as well as a plurality of checksums corresponding to different portions of the original data buffer.

As described herein, the original data buffer may be divided up into smaller chunks or portions corresponding to the smallest possible piece or fragment allowable in a system. In this example, the smallest piece or portion is a 10 K byte portion. Accordingly, the upper filter driver has determined and communicated to the lower filter driver a checksum for each 10 K portion of the original data buffer. For example, if the original data buffer is 100 K bytes, 10 checksums along with the IRP id of the parent or original data buffer are communicated to the lower filter driver and may be stored in a record or other data structure similar to that as shown as element 550. The lower filter driver or other body of machine executable code may build and maintain a linked list, an array, or other type of data structure that includes multiple instances of the record 550 when information is communicated from the upper to the lower filter driver.

Subsequently, the lower filter driver may use this data structure created that includes one or more instances of the record 550. Additional bookkeeping may be performed in an embodiment by the lower filter driver when processing a fragmented data buffer. A single original write data buffer may be divided into a plurality of fragments by the file system. As each of these fragments mapping to one or more pieces of the original data buffer pass through the lower filter driver, the lower filter driver may perform bookkeeping keeping track of what portions of the original data buffer have passed through. Referring back to our example of a 100 K byte buffer, a fragment may be received by the lower filter driver which is 40 K bytes in size. These 40 K bytes may correspond to the first 40 K bytes of the original data buffer. Upon detecting by the lower filter that this fragment has passed through, the lower filter driver may wish to indicate, for example, via a USE BIT what 10 K portions have been processed. Subsequently, when the lower filter driver determines that all portions or fragments of an original data buffer have passed through the lower filter driver, the lower filter driver may deallocate and remove from the list the associated record such as instance 550. The USE BIT fields 556a–556n may correspond to different portions of the original data buffer as represented by a single checksum value. It should be noted that other embodiments may use other mechanisms in performing this bookkeeping functionality.

It should be noted that this checksumming techniques may be used in connection with a buffer being written to a device. The data in the buffer is checksummed at the top of the I/O stack as described herein and validated by the data storage device before completing the write operation. If data validation fails, the write request also fails providing a host computer system with immediate feedback that the buffer was corrupted. This may be particularly useful, for example, when using unbuffered I/O operations as described elsewhere herein in which no caching of the data is performed by the file system. Using unbuffered I/O operations may increase the chance that the data buffer may be overwritten or corrupted since the application and drivers access the same buffer.

An embodiment using the Windows NT operating system and the NTFS file system described herein may need to include particular settings and conditions. The file associated with the checksum write operation should be aligned on a 4 k boundary. Additionally, the NTFS file system should be formatted with cluster size of 4 k or 1024 byte multiples. As described elsewhere herein, the file should be opened with the file system caching disabled, or using unbuffered I/O. The size of each write buffer should be an exact multiple of 4 k bytes and checksumming is to be enabled for the file.

It should be noted that checksumming may be enabled for a file using a variety of different techniques that may vary in accordance with each embodiment. In this particular embodiment with the NTFS operating system, this may be done, for example, through a registry setting or using an application that may pass file names to the upper filter indicating that particular files have checksumming enabled. An embodiment may also query an application for an indication as to which files have checksumming enabled. As also described herein, the checksum may be calculated by the upper filter level or may alternatively be calculated by another application and passed to the upper filter driver, for example, as a field a data buffer or utilizing other techniques known to those of ordinary skill in the art. The details of the location in the buffer of the particular checksum can either be put in the registry or sent by a small control application communicating this information to the upper filter driver.

As described herein, the upper filter intercepts each write buffer as it is submitted to the file system and identifies the target file for the buffer. If the file is not one that is being checksummed, the buffer is passed on through to the file driver. If the file is being checksummed, the checksum is either calculated or the application has embedded the checksum in the buffer and the checksum is now extracted. The upper filter then sends the IRP identifier along with the checksum to the lower filter as also described herein.

The lower filter may be characterized as one that intercepts the SCSI IRP and identifies which ones of the IRPs have checksumming enabled in accordance with information previously passed from the upper filter driver. When the lower filter identifies an IRP as one that requires checksum processing, it replaces SCSI write command with a unique, vendor defined write-and-validate SCSI command. The checksum may be embedded in the reserved byte of the CDB as this is acceptable for the vendor unique or vendor defined SCSI commands.

In this embodiment the data storage system may include one or more Symmetrix data storage systems that include micro code for receiving particular vendor defined SCSI write-and-validate commands. If the check and validation succeeds, then the write operation is performed. If the validation fails, an error is returned to the host and is in turn propagated back up the I/O stack. In other words, such an error is propagated back up through the different drivers associated with the NT I/O stack 109 included in illustration 80 of FIG. 5.

It should be noted that the data structures utilized by the lower filter driver in storing the IRP identifier and associated checksum may be any one of a variety of different data structures. In one embodiment, an array having a bounded index may be used in which each cell of the array includes a checksum. The index into the array may be the IRP index formed from the IRP identifier in which the array may include a number of elements in accordance with the range of IRP indices possible.

The different drivers, such as the upper level filter driver, may operate on a list of files in which each file has a particular file handle. A file handle may be a unique number assigned by the operating system. This file handle may be used, for example, when performing different operations in connection with the file.

It should be noted that with a particular embodiment, a problem may be encountered with registering file names and associated attributes, such as whether a file has checksumming enabled, when the files are stored utilizing a particular database or software application organization such as SQL or Exchange. The techniques that may be used to indicate whether a particular file has checksumming enabled may vary with the file and alternative functionalities included in each embodiment.

The foregoing provides a flexible and efficient technique for early detection of data corruption in connection with the write operation. In particular, this may be used in connection with performing a write operation to storage devices, such as the Symmetrix data storage system, which may be accessed by a plurality of different computer systems and users. Early detection of data corruption using the foregoing techniques may minimize additional subsequent data corruptions and minimize costs associated with error recovery. A particular host application may be notified of a data corruption as soon as it occurs prior to actually writing the data to a device. At this point, the particular host application may perform different types of error processing in accordance with a particular application.

It should also be noted that the techniques described herein may be used in connection with any one or more of a variety of different systems having different hardware and/or software in different data storage systems. A checksum is formed near or at the top of the I/O stack. A filter driver lower in the stack is notified that this particular buffer and associated write command has checksumming enabled such that the lower filter driver changes the SCSI command to the vendor-defined write command with the checksumming, and then adds the checksum to the command data block (CDB).

The foregoing describes techniques used in connection with performing checksumming in connection with a write operation. What will now be described are techniques that may be used in connection with a read operation.

End-to-end checksumming as described above for write operations may also be used in connection with a read operation of a data buffer from an "intelligent" storage system, such as described previously in connection with FIG. 2. A storage system may be characterized as "intelligent" if it includes, for example, hardware and/or software to perform support operations such as checksumming described herein and other functionality.

Figure 16:
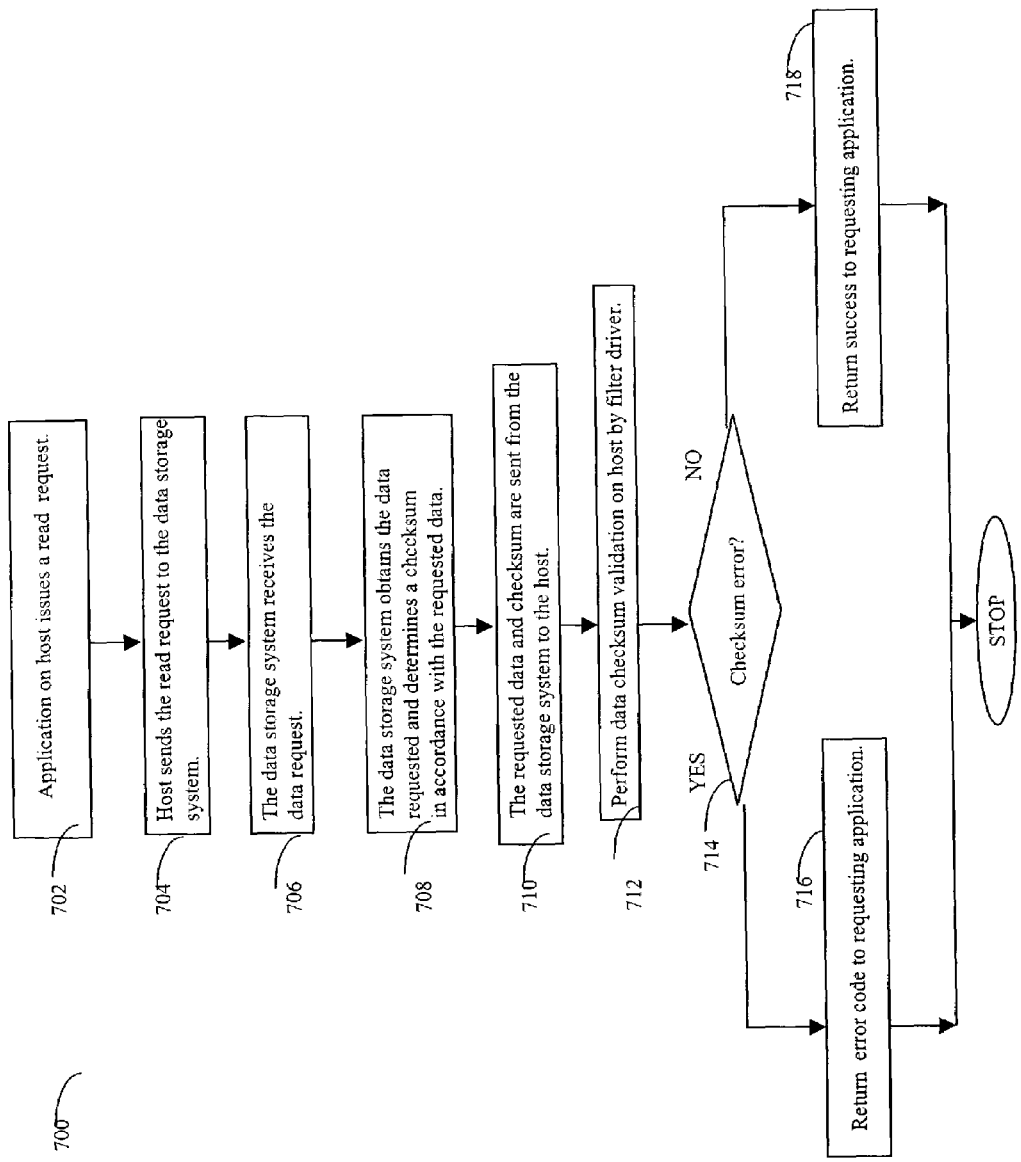
FIG. 16 is a flowchart of steps of an embodiment for processing a read I/O request.

Referring now to FIG. 16, shown is a flowchart 700 of steps of an embodiment for performing a read I/O operation or request. At step 702, an application executing on a host computer, for example, as described in connection with FIG. 3, may issue a read request for data stored in a storage system. At step 704, the host may send the read request to the data storage system. At step 706, the data storage system receives the read request. At step 708, the data storage system may obtain the data for the read request and may calculate a checksum for the data buffer before servicing the read request by returning requested data and checksum to the host. At step 710, the checksum may be passed to the host along with the requested data. At step 712, the checksum may be validated on the host, for example, at the top of the I/O stack by a file system filter driver on the host computer system. At step 714, a determination may be made as to whether a checksum error or data validation error has been detected. If so, control proceeds to step 716 where the requesting application may accordingly be notified as to the failure of the checksum validation. Otherwise, control proceeds to step 718 where the requesting application may be notified as to the success of the read request with no checksum validation error.

In one embodiment, the application may be notified, for example, by a return error code value. Other embodiments may use other techniques to notify an application that issues the read request.

The foregoing process outlined in FIG. 16 flowchart 700 will now be described in more detail. What will now be described is the solution of how to perform read checksum validation on the host side in accordance with a checksum passed from a data storage system to the host.

A few points should be noted about the embodiment that will be described in following paragraphs. In particular, the techniques that will now be described may work in connection with files that meet certain criteria. For example, as described in connection with performing the write checksum validation, certain restrictions may be placed on the type of file, attributes, and the like, in accordance with a particular operating system, such as the Windows NT operating system used in this particular embodiment. Similarly, in connection with performing the read checksumming, certain restrictions or criteria are included in this particular embodiment. The file in this example is opened with the file system caching disabled. Additionally, checksumming is enabled for the particular file which is being accessed with the read request. As described elsewhere herein, the checksumming enablement for a file may be done using the Windows NT registry setting to indicate the checksumming for a particular file is enabled. Alternatively, an embodiment may include an application to communicate a file name to an upper filter driver that is used in performing the read checksumming. These and other techniques may be used as described previously in connection with the write checksumming process to communicate to the upper filter driver that checksumming for a particular file is enabled. Additionally, an embodiment may also communicate the checksum, for example, associated with a read operation and its data buffer to the invoking application such as a database application. To communicate the checksum to the calling or invoking application executing on the host, the checksum value may be included in the data buffer passed back to the invoking application in a particular location such that the application knows where to look for the particular checksum value. The checksum value may also be communicated to the invoking application through another application. The location of the checksum within a buffer may also be published using the file registry. These and other techniques may be used to communicate the checksum to the invoking application.

As will also be described in following paragraphs, this particular embodiment may be used in connection with files such that all physical storage devices that provide storage for the particular file reside on the same data storage system. For example, in order to provide read checksumming validation processing on a fault tolerant volume that stripes data across disks, all of these disks reside on the same storage system, such as, for example, the same Symmetrix data storage system such as 20a. Other embodiments may include other varying criteria in connection with providing functionality for performing checksumming in connection with read operations.

The techniques used in connection with performing the read checksumming are similar to those described elsewhere herein in connection with performing the write checksumming operation and techniques. In particular, in connection with performing read checksumming in this embodiment described herein, three components may be used in performing the read checksumming validation. These three components include two filter drivers on the host to identify which buffer is to checksum, request the checksum from the storage system, and perform checksum validation. A third component is included in the data storage system such as, for example, in the data storage system microcode. The third component located within the data storage system performs checksum validation on the data which is read, and then sends the checksum back to the host along with the requested data for the read operation.

Figure 17:
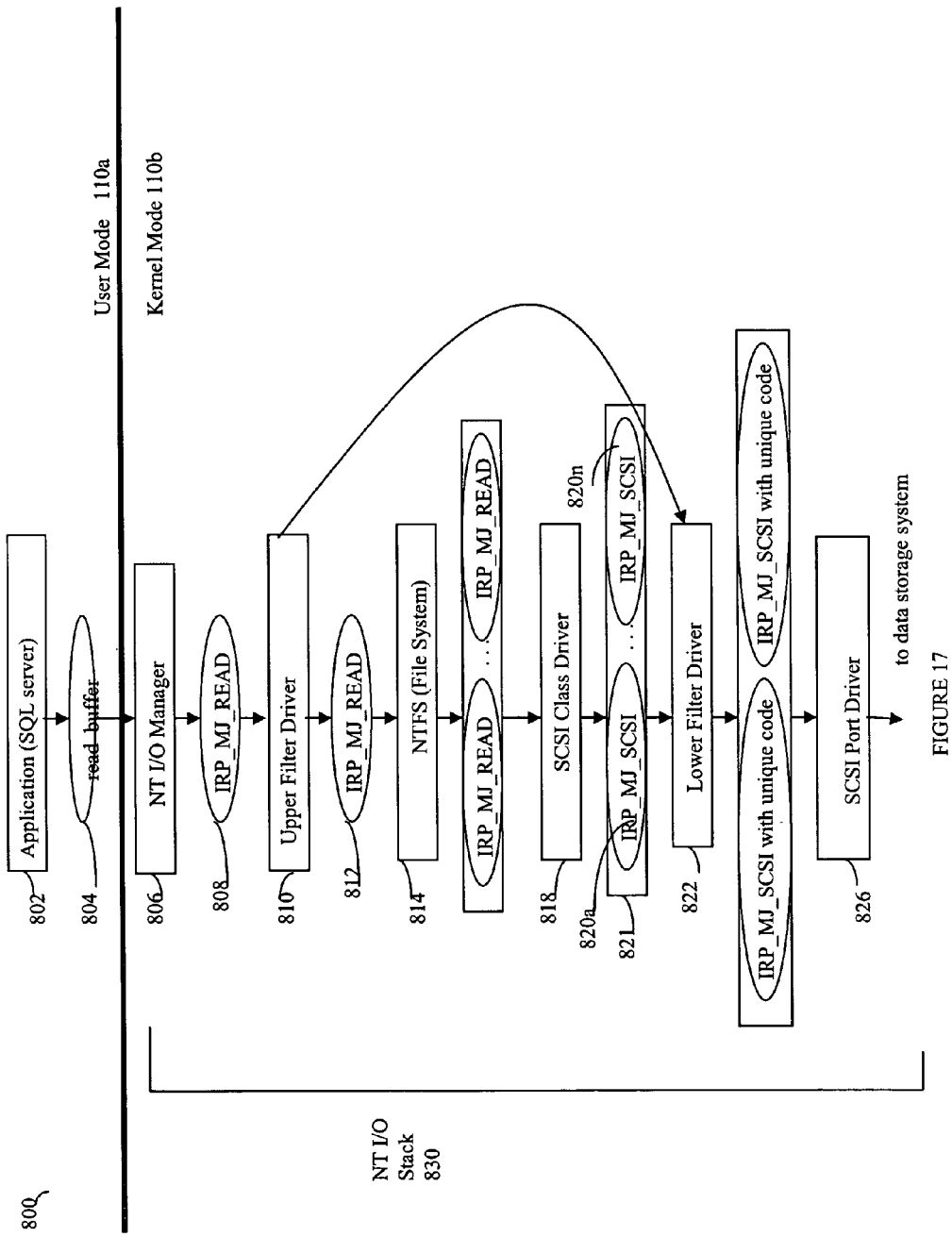
FIG. 17 is an example of an embodiment of software included in a host system for processing a read I/O request.

Referring now to FIG. 17, shown is an example of an embodiment of software 800 that may be included in a host system for performing read checksumming operations. It should be noted that many of the components or elements of FIG. 17 are similar to those described previously elsewhere herein such as, for example, in connection with FIG. 11 for performing the write checksumming operation. One point of difference is that all of the data structures, operation codes, and the like in FIG. 17 are directed to producing read requests.

An invoking application, such as application 802, may issue a read request and allocate storage accordingly in a read buffer 804. This read buffer is passed to the NT I/O manager 806 which produces an IRP corresponding to the read request 808. The upper filter driver 810 receives the read IRP and performs processing that will be described elsewhere herein. The upper filter driver 810 passes the read IRP to the file system 814 which in this example is an NTFS file system. The NTFS file system may pass one or more IRP read requests to the class driver 818. Similarly, as described in connection with the write requests, the file system may apportion a request into a plurality of child requests in accordance with criteria of a particular embodiment as described elsewhere herein. Once the class driver 818 receives the one or more read requests, the class driver 818 produces corresponding IRPs that include a standard SCSI command. These IRPs that include the SCSI commands 821 are passed to the lower filter driver 822 which performs additional processing in connection with performing the read checksumming. These IRPs which include information about the SCSI command are passed to the port driver 826 and forwarded on to the data storage system for servicing. In the embodiment described in following paragraphs, the lower filter driver modifies the SCSI IRP's to include a vendor unique function or operation code for a special READ request with checksumming. When a read request has been serviced, it is propagated backup the NT I/O stack 830. The techniques described herein provide for direct communication between the upper and lower filter drivers 810 and 822, respectively.

The upper filter driver 810, the lower filter driver 822 and communications therebetween are described in more detail in following paragraphs. When an application makes a read request, the application provides the buffer, for example, such as read buffer 804. The read request that includes the buffer specifies a size and a starting address that may be represented as a file plus a given file offset. A range of contiguous virtual addresses represents the buffer. These addresses may or may not correspond to contiguous physical memory addresses. Accordingly, the file system, such as the NTFS file system 814, creates a mapping of the virtual addresses to physical memory pages.

In one embodiment, this mapping of virtual addresses to physical memory pages in connection with a particular write request may correspond to a memory descriptor list or MDL. The lowest level driver included in the NT I/O stack uses the MDL to transfer data from the actual disk extents from the data storage unit to host memory when performing a direct memory access or DMA in this example. The file data corresponding to particular read requests may or may not reside in contiguous disk storage. Similar to as described elsewhere herein in connection with a write buffer for a write operation, when a read buffer is comprised of more than one disk extent, the file system such as the NTFS file system, breaks up the original read request into smaller requests, for example, such as one request corresponding to each disk extent.

The original read request may be represented by a single IRP such as IRP 812 of FIG. 17. If the request is broken into smaller requests, the original request IRP may be referred to as the master or parent IRP. Each of the smaller requests may be represented by a child IRP, such as the IRPs included in 821 identified at elements 820a–820n. Any one of a variety of different data structures may be used to relate the parent or master IRP and its one or more child IRPs. In one particular embodiment described elsewhere herein, each child IRP has a pointer back to its parent or master IRP. In connection with a read request, the NTFS file system 814 places the master IRP on a list in the event that the file system breaks up the original read request into smaller requests.

Before communicating with any filter driver or other component above the file system level in the representation 800 of FIG. 17, the file system waits until all of the child IRPs have completed. Upon completion of all the child IRPs, the master IRP has completed and communications may resume in connection with those read requests between the file system and those drivers such as the upper filter driver, the NT I/O manager, and any other layers above the file system 814 in accordance with the structure of FIG. 17 for the NT I/O stack 830.

The one or more child IRPs 821 in connection with a single master or parent IRP issued by an application are passed on the stack until it reaches the SCSI class driver 818. It should be noted that the file system may not produce a plurality of child IRPs corresponding to a single received IRP. The filesystem may in fact have only a single IRP as an output. In turn, the SCSI class driver 818 constructs an SRB describing the request to the SCSI port driver 826 and a CDB which may be sent to the data storage system. Both the SRB and the CDB are described elsewhere herein. It should be noted that in this particular embodiment there is one SRB and one CDB per disk extent.

Figure 18:
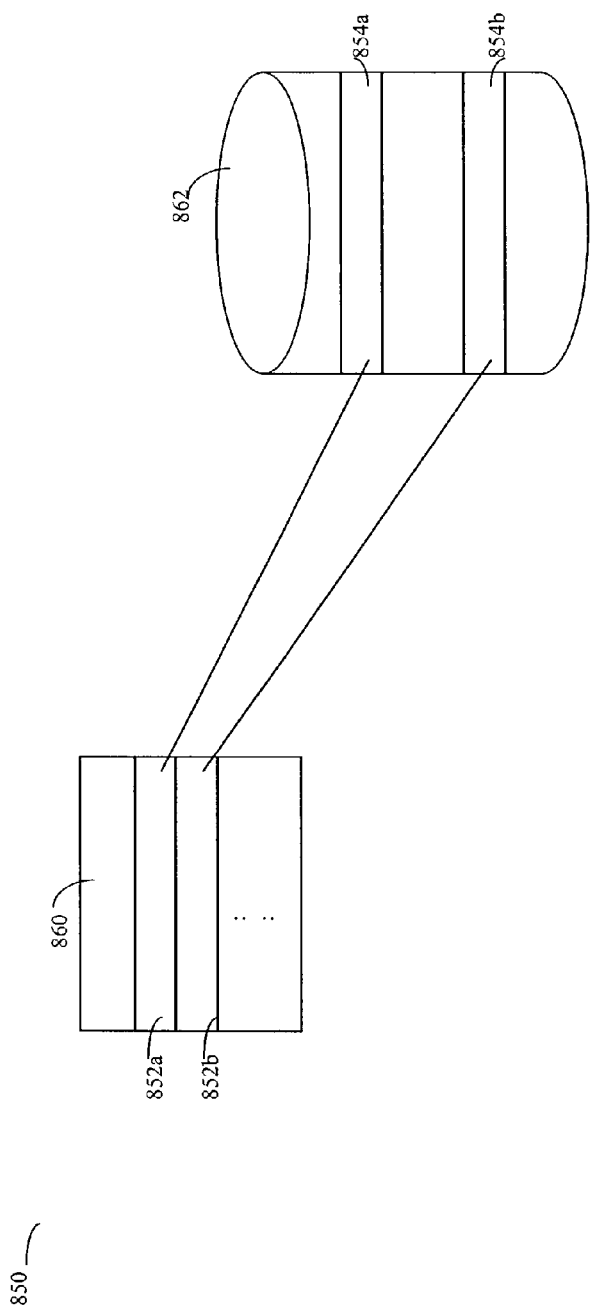
FIG. 18 is an example of a representation of mapping a logical file representation of addresses to locations on a data storage device.

Referring now to FIG. 18, shown is an example 850 of a representation of the mapping of logical file representation of addresses to respective locations on the data storage device. The representation 850 includes a logical file representation 860 and disk addresses for a storage device 862. It should be noted that in this particular example, the disk or storage device 862 may be an LV or logical volume as well as a particular physical volume. The file system represents the file as a contiguous range of offsets. File portion 852a begins at a particular offset and portion 852b may be represented as the next logical contiguous portion at a second offset within the file. Each of these particular portions such as 852a may map to a particular disk extent such as 854a. It should be noted that although the two portions 852a and 852b are logically contiguous in connection with the logical representation of the file 860, each of these portions do not correspond to contiguous portions on the storage device 862 as indicated by the corresponding non-contiguous portions 854a and 854b.

Figure 19A:
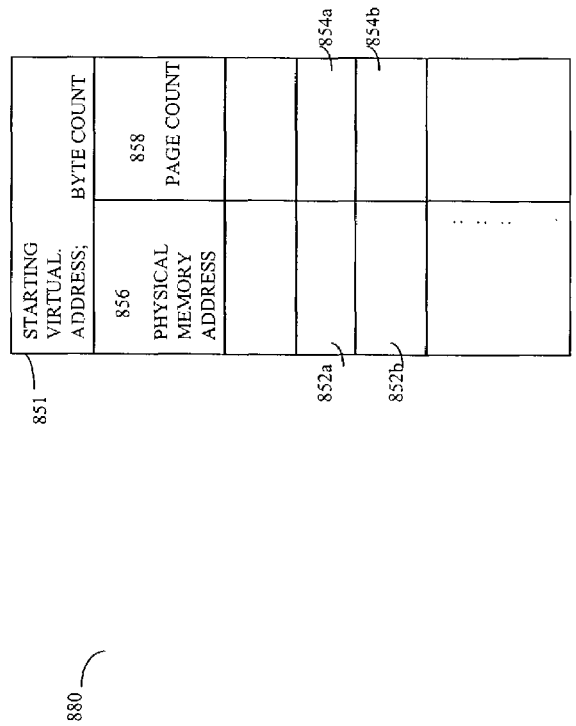
FIG. 19A is an example of an embodiment of a memory descriptor list (MDL)

Referring now to FIG. 19A, shown is an example of the representation of an MDL data structure 880. In this example, the MDL may be organized as a table including a header portion 851 that includes a starting virtual memory address and byte count corresponding to the MDL. Starting at this virtual address are the contents included in the physical memory addresses as identified by the pairs of physical memory address and page counts in columns 856 and 858, respectively. Each pair (856, 858) in an entry of the table 880 represents a starting physical address 856 and the number of physical pages 858 starting at that the address.

MDLs may be characterized as describing the virtual (logical) to physical address mapping on the host system. In this embodiment, one MDL is created by the file system for each disk extent.

Figure 19B:
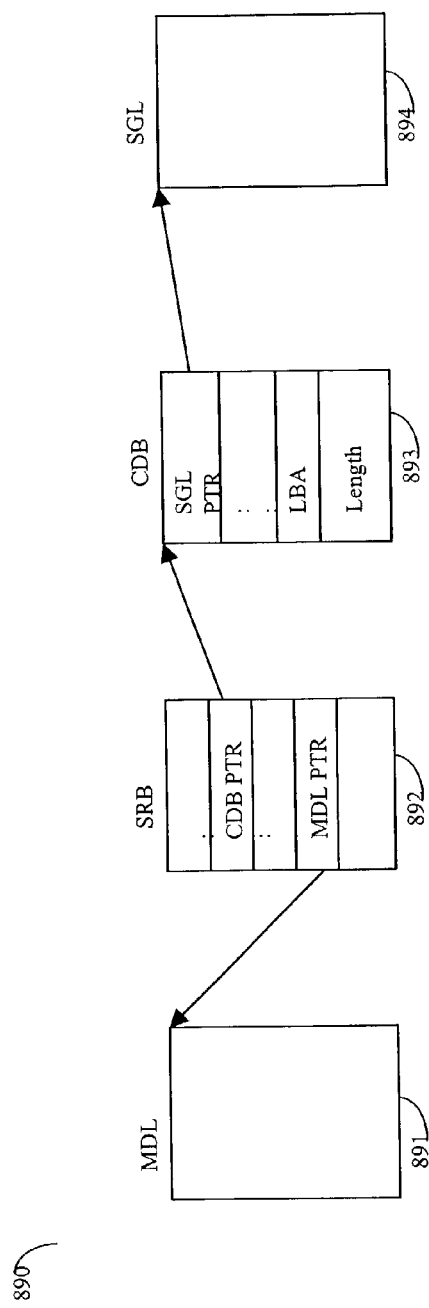
FIG. 19B is an example of an embodiment of how the MDL relates to other data structures used.

Referring now to FIG. 19B, shown is an example 890 of how various data structures described herein may be related. The SRB 892 includes a pointer to the MDL 891 and the corresponding CDB 893. The CDB 893 includes a pointer to the Scatter Gather List (SGL) 894 generated from the MDL 891. The SGL is described in more detail elsewhere herein. As illustrated, the SRB has a pointer to the MDL that describes the host memory area corresponding to the disk extent being read by the SRB. The CDB includes a field LBA identifying the logical block address on the physical disk of the associated data.

To provide end-to-end checksumming validation in connection with read requests, a storage system may provide a checksum for each buffer of data transmitted. Additionally, the checksum is validated at the top of the I/O stack immediately before notifying the calling application that the read has been completed. The techniques that are described in following paragraphs utilize the two filter drivers and the components included in the data storage system to communicate the checksum as maintained on the storage system to the host. Additionally, the techniques handle the case where a single read request may be broken up into two or more smaller requests. In connection with performing I/O operations within the Windows NT operating system as described herein, the CDB includes a scatter-gather list or SGL constructed from the MDL.

Figure 20:
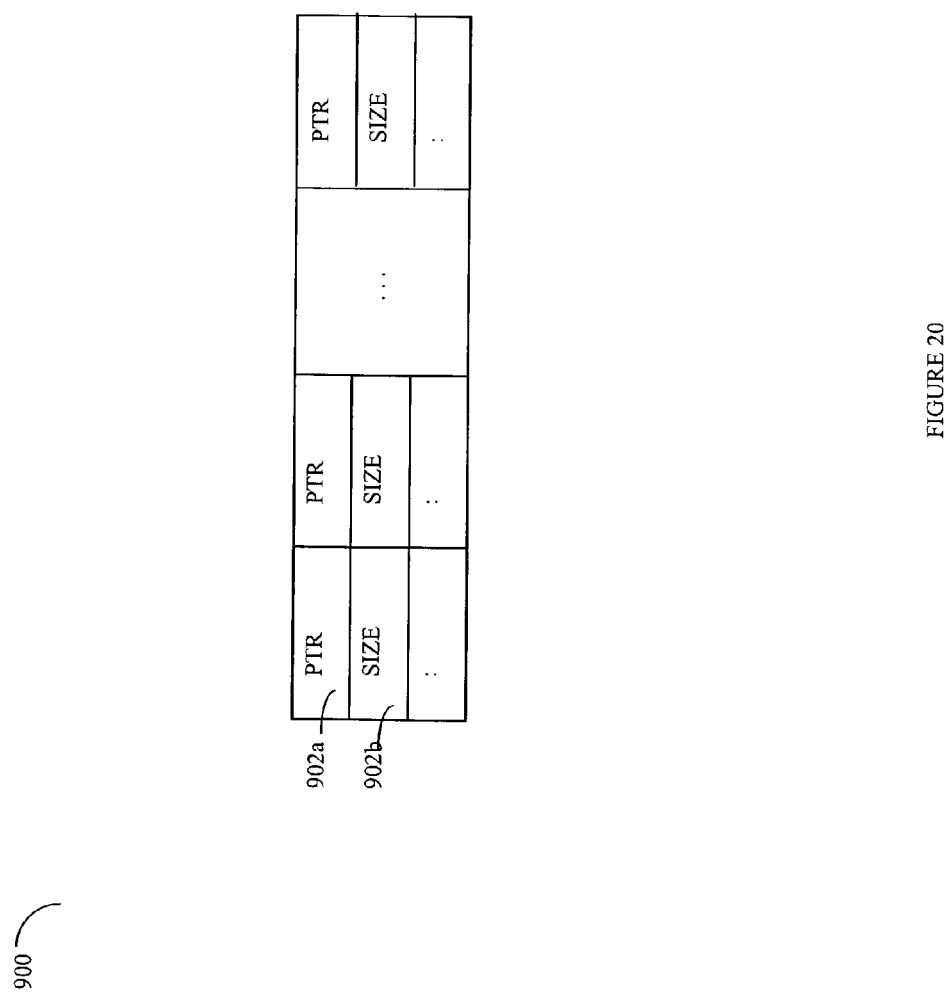
FIG. 20 is an example of an embodiment of a scatter-gather list (SGL)

Referring now to FIG. 20, shown is an example of an embodiment 900 of a scatter-gather list. A scatter-gather list may be implemented as an array as shown here, a linked list or other equivalent data structures as known to those skilled in the art. In this particular embodiment, an array may include one or more entries in which each entry includes information referencing a particular portion of memory. In particular, an entry includes a PTR field 902*a* a size field 902*b* and other information may also be included. The PTR field 902*a* may be a pointer or an address to a particular buffer area of memory. Size field 902*b* indicates the size of the buffer portion identified by the address in the field 902*a* PTR. Using this particular data structure, the actual physical location of data or memory locations associated with a logical data buffer may be represented.

In connection with using an SGL with performing I/O operations, the operating system and drivers normally provide for the SGL referring to a range of memory addresses exactly large enough to accommodate the requested data. One problem is in using an SGL and MDL is determining a location for the checksum information be stored to allow for the checksum to be communicated from the data storage system to the host in a single transaction such as in a "piggyback" fashion with respect to the read request data.

An embodiment may consider a separate transaction to retrieve the checksum value separate from the read request. However, this may impose too great of a performance impact on the system for every read request to have data validation using the checksum by requiring a separate transaction between the data storage system and the host. The upper filter driver in conjunction with the lower filter driver provide a technique for communicating the checksum from the data storage system to the host for a particular read request. Additionally, the use of these two filter drivers also provides a way to associate the original read request with one or more smaller requests that may be produced by the file system as described elsewhere herein.

As described in connection with FIG. 17, the upper filter driver 810 sits just above the file system and intercepts all I/O requests such as the read I/O request. The upper filter has the job or functionality to provide the lower filter driver 822 with sufficient information such that the lower filter driver 822 may identify which of the read requests, and possibly subdivided read requests, are associated with an original read request having checksum validation enabled. Additionally, the upper filter may perform final checksum validation when all of the data associated with a single top level read request has been received.

When the upper filter receives all I/O requests, the upper filter driver identifies which of those I/O requests are associated with IRPs for files having the checksum feature enabled. Different ways of communicating this information to the upper filter driver are also described elsewhere herein. When the upper filter driver detects an IRP having the checksum feature enabled, it determines if the request is in connection with a read operation. If so, the upper filter driver allocates and initializes particular fields of a data structure referred to as IRP_READ_RECORD in this particular example. Each of the IRP_READ_RECORDs may include information such as, for example, a pointer to the IRP for the request currently being processed, the number of bytes of the read request, the number of bytes that have actually been read or processed, and the checksum value. Once a record is allocated in connection with a read request having checksumming enabled, a pointer to this particular instance of the IRP_READ_RECORD data structure may be stored in a fixed length array. The array may be indexed by hashing the IRP pointer or address using the following representation:

hash_value=IRP POINTER/sizeof(pointer_type))%array_size where;

hash_value=index into array

IRP_POINTER=pointer to the Master or Parent IRP sizeof(pointer_type)=size, in bytes of a pointer (e.g., 4 on Win32, 8 on Win64)

array size=number of array elements

%=MOD function outputs the remainder

It should be noted that other embodiments may use other hashing techniques and other techniques to access, store and retrieve the stored data in accordance with the particular data structures included in an embodiment.

Figure 21:
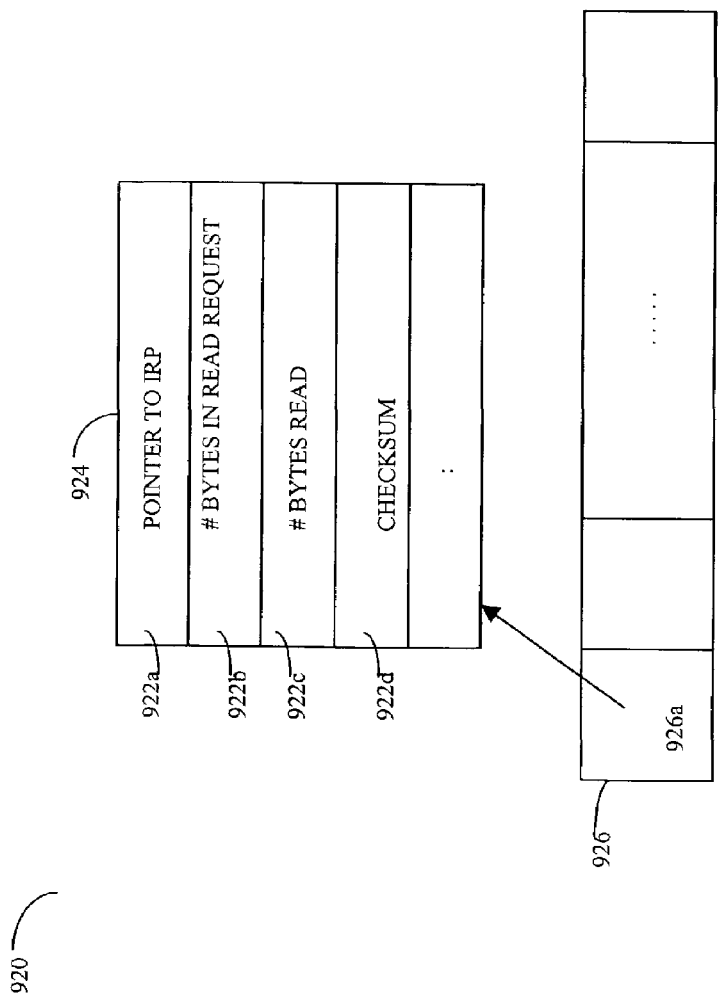
FIG. 21 is an example of an embodiment of data structures used in connection with checksumming for read operations.

Referring now to FIG. 21, shown is an example of the data structures created by the upper filter in connection with checksumming for read operations. This example 920 includes an array 926 having an array of pointers such as 926A. An entry in this array such as 926*a* may point to an instance of a record structure 924, such as the IRP_READ_RECORD. The instance of the IRP_READ_RECORD 924 may include a plurality of data fields or records. In this particular example, the IRP_READ_RECORD 924 includes a pointer to the IRP 922*a*, a field indicating a number of bytes within the actual read request 922*b*, a field indicating the number of bytes actually read in connection with the data operation 922*c*, and a checksum field 922*d*.

The array 926 is accessible and may be used by both the upper and lower filter drivers. Since both the upper and lower filters may be accessing this array in connection with reading and writing operations, synchronization between these two filters may be controlled using any one of a variety of different synchronization techniques, such as the use of a spinlock.

In this particular example, a spinlock may be implemented as a kernel resource identified by a particular process ID of the current owner and the count value. The current owner process ID may correspond, for example, to that of a lower or upper filter driver. Only one process may own a given lock at any time. A single process may hold multiple locks at the same time. Using different functions that may be included within an embodiment to obtain the lock, a process may obtain and own the lock if no one else or no other process has already obtained it. The lock is marked with a particular process ID of the process which currently holds the lock. In one embodiment, a spinlock has an associated counter that is incremented from minus 1 to zero with a first access, such as via a call to a function such as GetLock.

Each time the same process or owner process attempts to obtain the lock again, the counter may again be incremented. Subsequently, each time an owner process calls a complementary function to release the lock, the counter may be decremented. When the counter again reaches its initial value, such as −1 in this example, the lock may be released. In other words, a process may invoke a particular function to obtain the lock and a particular function to release the lock. If the same process which is the owner performs multiple calls to the GetLock function to obtain the lock, a counter is incremented from the initial value. It is not until this counter has been decremented one or more times to reach its initial value that the lock is released from the current owner process.

If a process attempts to access a lock associated with the shared resources, such as the array when the GetLock function is invoked, the process will be blocked. The blocked process, for example, may repeatedly "spin" or wait until the lock may be obtained. In this embodiment, a spinlock is used in synchronizing access to the shared resource. Spinlocks are included for use with the Microsoft Windows NT operating system as included in the Driver Development Kit (DDK) by Microsoft Corporation. Additionally, other documentation, such as the book entitled "Inside Windows 2000" by David Solomon, and "Inside WindowsNT" by Helen Custer, describes the functionality associated with spinlocks. In this embodiment, spinlocks may be used because other synchronization techniques, such as putting a blocked process to "sleep" may not be utilized in this embodiment in which the processor is running at elevated priority levels. The synchronization techniques, such as using a system supplied sleep function or equivalent associated with user mode processes while a process is blocked and waiting for a resource, may be used when the processor is running at user level priority mode, not elevated kernel mode as in this instance.

At various stages during execution such as in connection with accessing the array, the kernel guarantees that one, and only one, processor at a time is executing within a critical section. Kernel critical sections are the code segments that modify a global data structure, such as the array. The operating system can't function correctly unless the kernel can guarantee that threads access these global data structures in a mutually exclusive manner. One concern is the occurrence of interrupts in connection with providing exclusive access to the shared resource. For example, the kernel may be updating a global data structure when an interrupt occurs whose interrupt-handling routine also modifies the structure. Single-processor operating systems may prevent such a scenario by disabling all interrupts each time they access global data.

Other operating systems, such as Windows 2000 by Microsoft, may employ different techniques. Before using a global resource, the kernel process or thread temporarily masks those interrupts whose interrupt handlers also use the resource. It does so by raising the processor's IRQL to the highest level used by any potential interrupt source that accesses the global data. For example, an interrupt at DPC/dispatch level causes the dispatcher, which uses the dispatcher database, to run. Therefore, any other part of the kernel that uses the dispatcher database raises the IRQL to DPC/dispatch level, masking DPC/dispatch-level interrupts before using the dispatcher database. The foregoing works within a single-processor system, but it's inadequate for a multiprocessor configuration. That is, raising the IRQL on one processor doesn't prevent an interrupt from occurring on another processor. The kernel also needs to guarantee mutually exclusive access across several processors in a multiprocessor system.

In connection with a guaranteeing multiprocessor mutual exclusion the spinlock locking primitive associated with a global data structure, such as one associated with the array, may be used. Before entering a critical section, the kernel acquires the spinlock associated with the global resource. If the spinlock isn't free, the kernel keeps trying to acquire the lock until it succeeds. The spinlock gets its name from the fact that the kernel (and thus, the processor) is held in limbo, "spinning," until it gets the lock. Spinlocks, like the data structures they protect, reside in global memory. An embodiment may implement the code to acquire and release a spinlock in assembly language for speed and may also utilize locking mechanism the underlying processor architecture may provide, that may vary in accordance with each embodiment. An architecture may implement spinlocks with a hardware-supported test-and-set operation, which tests the value of a lock variable and acquires the lock in one atomic instruction. Testing and acquiring the lock in one instruction prevents a second thread from grabbing the lock between the time when the first thread tests the variable and the time when it acquires the lock. All kernel-mode spinlocks in Windows 2000 have an associated IRQL that is always at DPC/dispatch level or higher. Thus, when a thread is trying to acquire a spinlock, all other activity at the spinlock's IRQL or lower ceases on that processor. Because thread dispatching happens at DPC/dispatch level, a thread that holds a spinlock is never preempted because the IRQL masks the dispatching mechanisms. This masking allows code executing a critical section protected by a spinlock to continue executing so that it will release the lock quickly. It should be noted that a kernel thread using spinlocks should minimize the number of instructions executed while holding a spinlock. In Windows 2000, the kernel makes spinlocks available to other parts of the executive through a set of kernel functions, including KeAcquireSpinlock and KeReleaseSpinlock. Device drivers, for example, require spinlocks in order to guarantee that device registers and other global data structures, such as the array described elsewhere herein, are accessed by only one part of a device driver (and from only one processor) at a time. It should be noted that kernel spinlocks in an embodiment, such as Windows 2000, may carry with them restrictions for code that uses them. For example, in Windows 2000, because spinlocks always have an IRQL of DPC/dispatch level or higher, code holding a spinlock will crash the system if it attempts to make the scheduler perform a dispatch operation or if it causes a page fault. In connection with single-processor systems for Windows 2000, because the IRQL is an effective synchronization mechanism, the spinlock acquisition and release functions of may implement spinlock functionality by raising and lowering the IRQL.

As described herein, functionality of spinlocks may be used in a single or a multiprocessor system. Consider, for example, two threads running at elevated priority level. One thread, such as a writer, wants to acquire the resource but it cannot acquire the resource because the other thread currently has the resource. The spinloek guarantees that the thread acquiring the resource for write access does not release the resource or the processor until the thread is done with the resource. In this way, the spinlock guarantees exclusive access to the resource by not releasing the processor for use by another thread, such as another waiting thread. In a single processor system, this means that a first thread that acquires the resource and doesn't release the resource until done. Then, the next thread scheduled to run does so, such as the next thread trying to also acquire the spinlock for the shared resource. In a multi-processor system, before entering a critical code section to operate on the shared resource, the thread must acquire the spinlock. If the spinlock is not free and is currently acquired by another thread executing on another processor, a waiting thread keeps trying to acquire the lock until it succeeds. The waiting thread, and the processor which is executing the code of the waiting thread, is held in a wait state, "spinning" until the waiting process gets the lock.

It should be noted that an embodiment's implementation of spinlocks may provide different solutions to handling synchronization between readers and writers to allow multiple readers and no writers, or a single writer and no readers, simultaneous access to the shared resource using spinlocks.

The upper filter driver also performs additional processing upon receipt of all the disk extents associated with the read and completion of all of the child IRPs, if any, in addition to the original IRP. Upon completion of all of the child IRPs such that all data associated with the read request has been serviced and received by the host, the upper filter driver calculates the checksum for the buffer and compares it against the value as passed by the lower filter in the data structure, such as the shared array as shown in connection with FIG. 21. If the validation fails, an error is returned to the calling application. Otherwise, a return code may be passed to the calling application. Subsequently, the upper filter may remove the entry, such as 924, from the array in connection with performing cleanup operations subsequent to completion of processing a read request.

Figure 22:
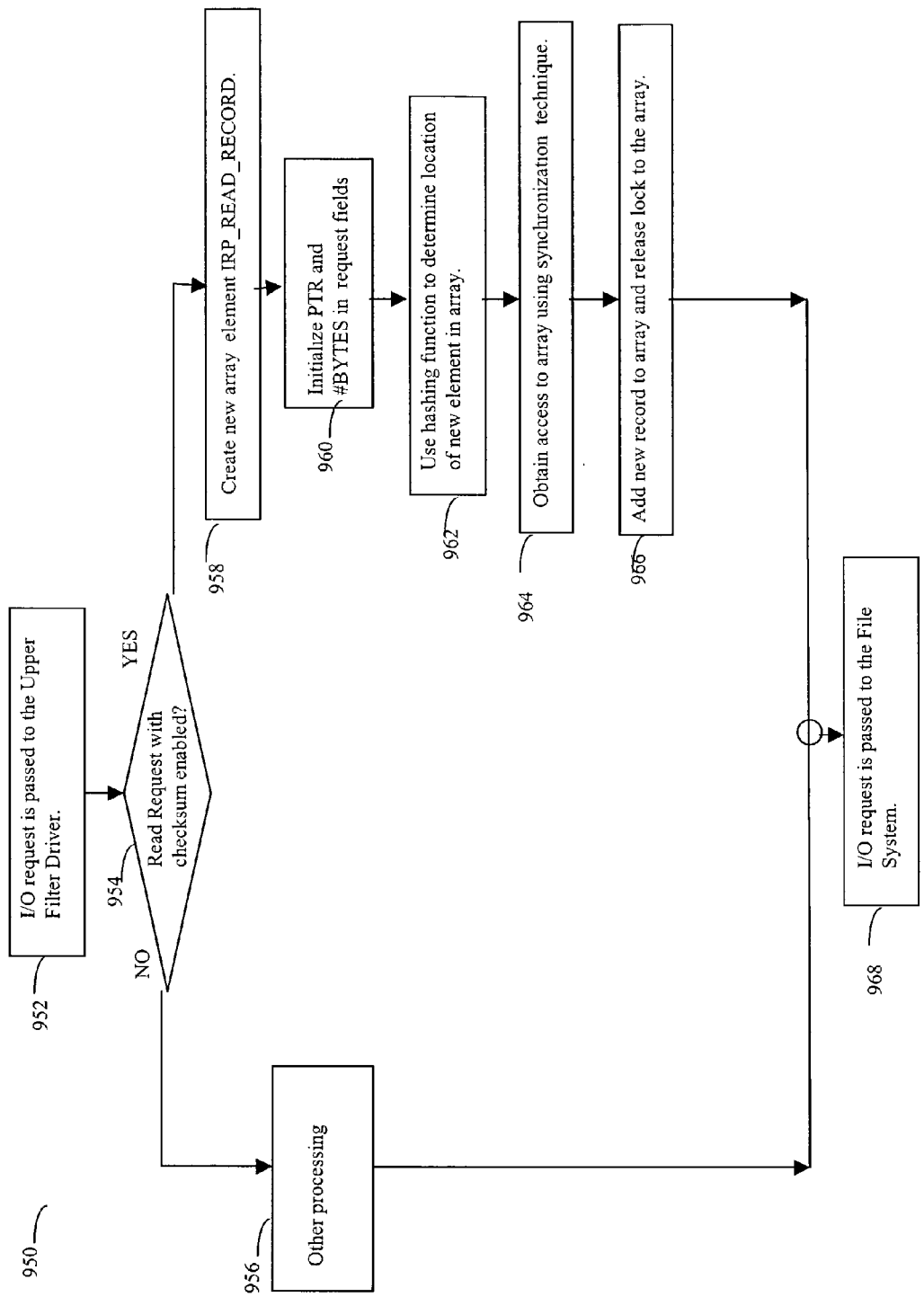
FIGS. 22–23 are flowcharts of an embodiment of method steps that may be performed by the upper filter driver.

Referring now to FIG. 22, shown is a flowchart 950 of steps of an embodiment that may be performed by the upper filter driver in connection with processing a read request. In this particular example, the method steps may be executed by the upper filter driver in connection with forwarding the read request down the NT I/O stack. At step 952, the I/O request is passed to the upper filter driver. At step 954, it is determined whether this is a read request. At step 954, if a determination is made that the received request is not a read request, control proceeds to step 956 where other processing is performed in accordance with the type of operation or I/O request.

If at step 954 it is determined that the current I/O request is a read request with checksumming enabled for the associated file, control proceeds to step 958 where a new array element of IRP_READ_RECORD type is created and allocated. At step 960, various fields may be initialized, such as the PTR field and the number of bytes in the request field. Control proceeds to step 962 where a hashing function is used to determine the location of this newly created element in the array. At step 964, access to the array is obtained using the synchronization technique included in this embodiment which is a spinlock. At step 966, the new record is added to the array as an element and any locks obtained in connection with the array access are released for other processes to access. Control proceeds to step 968 where the I/O request is passed to the file system.

Figure 23:
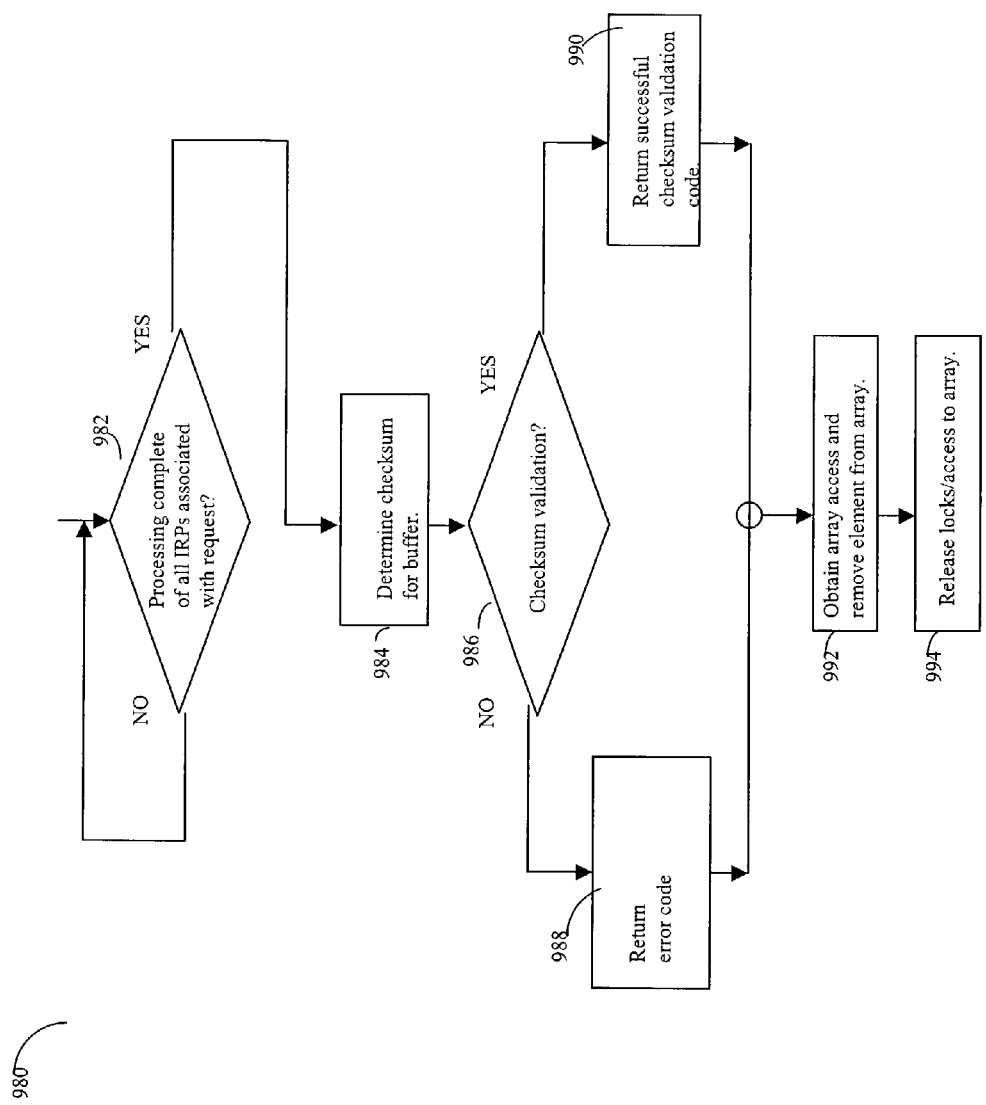

Referring now to FIG. 23, shown is a flowchart 980 of steps of an embodiment that may also be performed by the upper filter driver in connection with processing an I/O request. The steps of flowchart 980 may be performed by the upper filter driver upon completion of all IRPs associated with a parent or master IRP or read request. At step 982 a determination is made as to whether the processing is complete for all of the IRP, associated with a single read request or master IRP. If not, control proceeds to step 982 where there is a wait until all the processing of the IRPs associated with the request have been completed. At step 982, when a determination is made that all of the processing for all of the IRPs associated with the read request are complete, control proceeds to step 984 where the checksum for the buffer is determined in accordance with the data in the read buffer. At step 986, a determination is made as to whether the checksum determined at step 984 matches the expected checksum as returned from the data storage system for the data buffer. If the checksum validation has not been successful, control proceeds to step 988 where an error code is returned to the calling application. Otherwise, at step 986 the determination is made that the checksum validation is successful and complete, control proceeds to step 990 where a successful checksum validation code may be returned to the invoking application.

After processing of step 988 and step 990, control proceeds to step 992 where access to the array is obtained, such as via a spinlock or other synchronization technique. The array element associated with the current read I/O request is removed from the array. Subsequently, control proceeds to step 994 where any locks are released in connection with obtaining access to the array.

What will now be described are processing steps that may be performed by the lower filter driver in connection with processing a read request. When a lower filter driver receives a read request, the lower filter driver determines whether the request is associate with a file that has checksumming enabled.

As described elsewhere herein, the IRP as viewed and received by the lower filter driver may fall into one of three categories: 1) an IRP associated with a buffer that has not been subdivided by the upper filter driver, 2) a child IRP of a master or parent IRP in the instance where a read buffer was subdivided, or 3) neither type 1) or 2) in the instance where the buffer is not associated with a checksum enabled file associated with a read request.

The lower filter driver makes a determination as to the type of IRP it receives by examining the shared array, for example, using the hashing technique described elsewhere herein, for an entry in the array whose IRP pointer matches that of the received IRP. Alternatively, if the read request has been subdivided by the file system, the master or parent IRP of the IRP received by the lower filter driver may match an entry on the shared array list identifying the received request as a read request with checksumming enabled.

The lower filter also includes techniques for how to transfer a checksum from the data storage system to the host. In processing other types of data operations, the SCSI port driver in the host uses the MDL which describes the application supplied buffer to create a scatter-gather list or SGL as described elsewhere herein. The SGL may be used to describe the buffer in such a way that the DMA or direct memory access controller on the data storage system can transfer the requested data from the storage system directly into the buffer on the host side. In connection with the normal read request, the only data that is transferred or sent from the data storage system to the host is that which is associated with the servicing of the read request. A technique described elsewhere herein that may be used in communicating a checksum between the data storage system and the host includes the lower filter driver first sending a CDB to the storage system requesting that the checksum be DMA'd to the host. However, overhead involved with a separate DMA operation for transmitting just the checksum may have an unacceptable performance impact.

Accordingly, a different technique may be used as will be described in following paragraphs to communicate the checksum from the data storage system to the host. This technique provides additional space in host memory so that the storage system can append the checksum to the data buffer and DMA the checksum along with the data in a single transmission.

Figure 24:
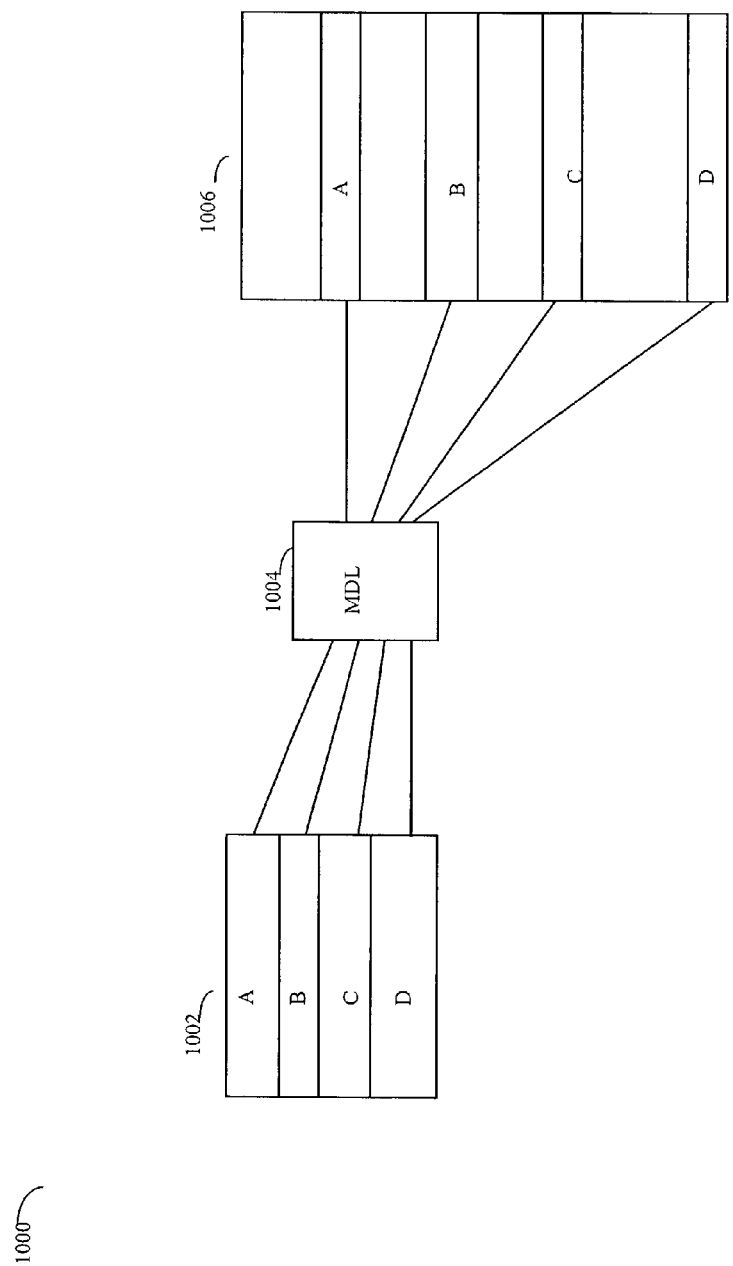
FIG. 24 is an example of an embodiment illustrating an MDL mapping virtual addresses of a read buffer to physical memory.

Referring now to FIG. 24, shown is an example of an embodiment 1000 showing how a read buffer is originally mapped into physical memory by an MDL. The original read buffer 1002 is mapped by MDL 1004 into physical memory 1006. Each of the different portions of the virtual address of the read request 1002 such as A, B, C and D are also shown in physical memory 1006 at similarly labeled locations. In this particular instance, assume the master IRP or parent IRP corresponding to the buffer 1002 is subdivided into a plurality of child IRPs. One of the child IRPs corresponds to writing portion A of the original read request. One important point to note is that each of the child IRPs uses the same MDL as the parent IRP which is MDL 1004 in this instance. When the SCSI port driver services a child IRP, the SCSI port driver uses a subset of the pages described in the MDL 1004 to construct a corresponding SGL.

It should be noted that if, when servicing a child IRP, the data storage system appends checksum information to the data buffer being transferred, the data storage system overwrites a portion of the read buffer that may not belong to the child IRP. If the child IRP is the last portion in the buffer, then the read checksum information is written to memory that doesn't belong to the read request at all. To solve this particular problem, the lower filter driver first makes a copy of the original MDL such as 1004. Additionally, the lower filter driver allocates an extra page of physical memory dedicated to receiving the checksum information associated with the read request.

Figure 25:
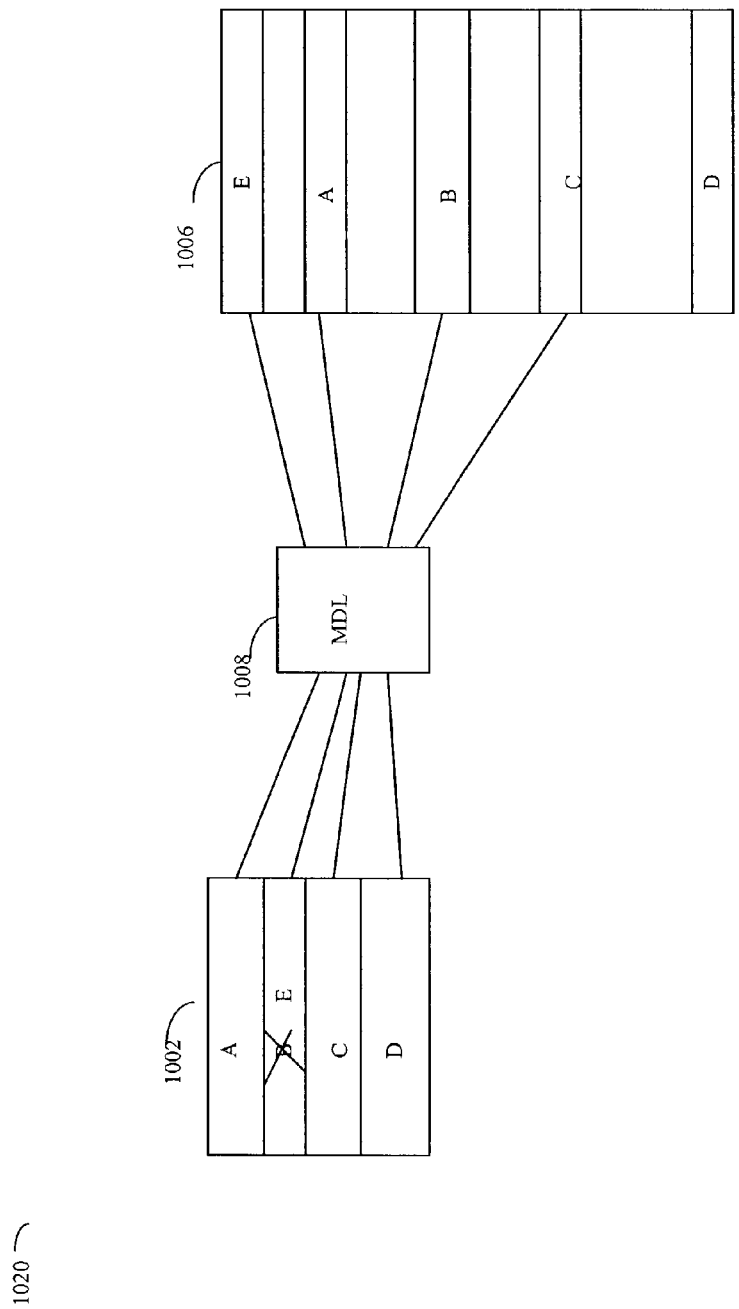
FIG. 25 is an example of an embodiment illustrating a revised MDL mapping virtual addresses of a read buffer to physical memory including an additionally allocated portion for a checksum.

Referring now to FIG. 25, shown is an example of an embodiment 1020 of virtual physical memory mapping used in connection with the processing of the lower filter driver. It should be noted that the physical memory 1006 as compared to the physical memory 1006 of FIG. 24 includes an additional portion allocated E. This additional portion E is allocated by the lower filter driver to receive the checksum information from the data storage system. The lower filter driver additionally modifies the physical page address within the MDL 1004 of the page immediately following the last page filled with data by the IRP being processed. As described elsewhere herein, the child IRP in this instance is reading portion A. Subsequently, the following portion was B and will now be made E as indicated in the revised table 1002. The MDL has been modified such that the page address following the page address of portion A is that of the memory page allocated to receive the checksum information, portion E. Since this child IRP is reading section or portion A, the new MDL 1008 provides storage for the originally requested data of portion A and the checksum data as will be included in portion E in this example.

Once this is accomplished, the lower filter driver replaces the original MDL in the IRP structure with this new MDL. Additionally, the lower filter driver changes the command included in the CDB from the standard SCSI read command to a vendor unique code indicating a vendor defined read command indicating to the data storage system that the data storage system is to additionally provide a checksum when servicing this read request. The storage system, when servicing the request in accordance with this vendor unique code, appends the checksum information to the data. In this instance, the data will be placed in portion corresponding to memory A and the checksum is subsequently be transferred in the same DMA operation in the physical memory corresponding to virtual address space for portion E. When the DMA is complete, the lower filter's completion routine is called. In other words, when this particular child I/O request is complete, a completion routine within the lower filter process is called. At this point, the lower filter driver looks up in the shared array of IRP_READ_RECORD structures, the master IRP of the request just completed. Accordingly, the lower filter driver updates the number of bytes read in the checksum field. In other words:

bytes read=#bytes read+#bytes received for current read request/child IRP.

When the last child IRP is complete, the #bytes read is equal to the #bytes of the original parent/master IRP request. The completion of the last child IRP associated with a particular parent/master IRP is detected by the file system which then passes control to the upper filter driver with information regarding the original IRP indicating to the upper filter driver that all child IRPs, if any have complete.

It should be noted that an embodiment may optionally elect to omit the BYTES READ portion of each record described above if the file system handles keeping track of when all child IRPs have been processed. In other words, the file system driver does not pass control to the upper filter driver until all child IRPs have been processed.

Figure 26:
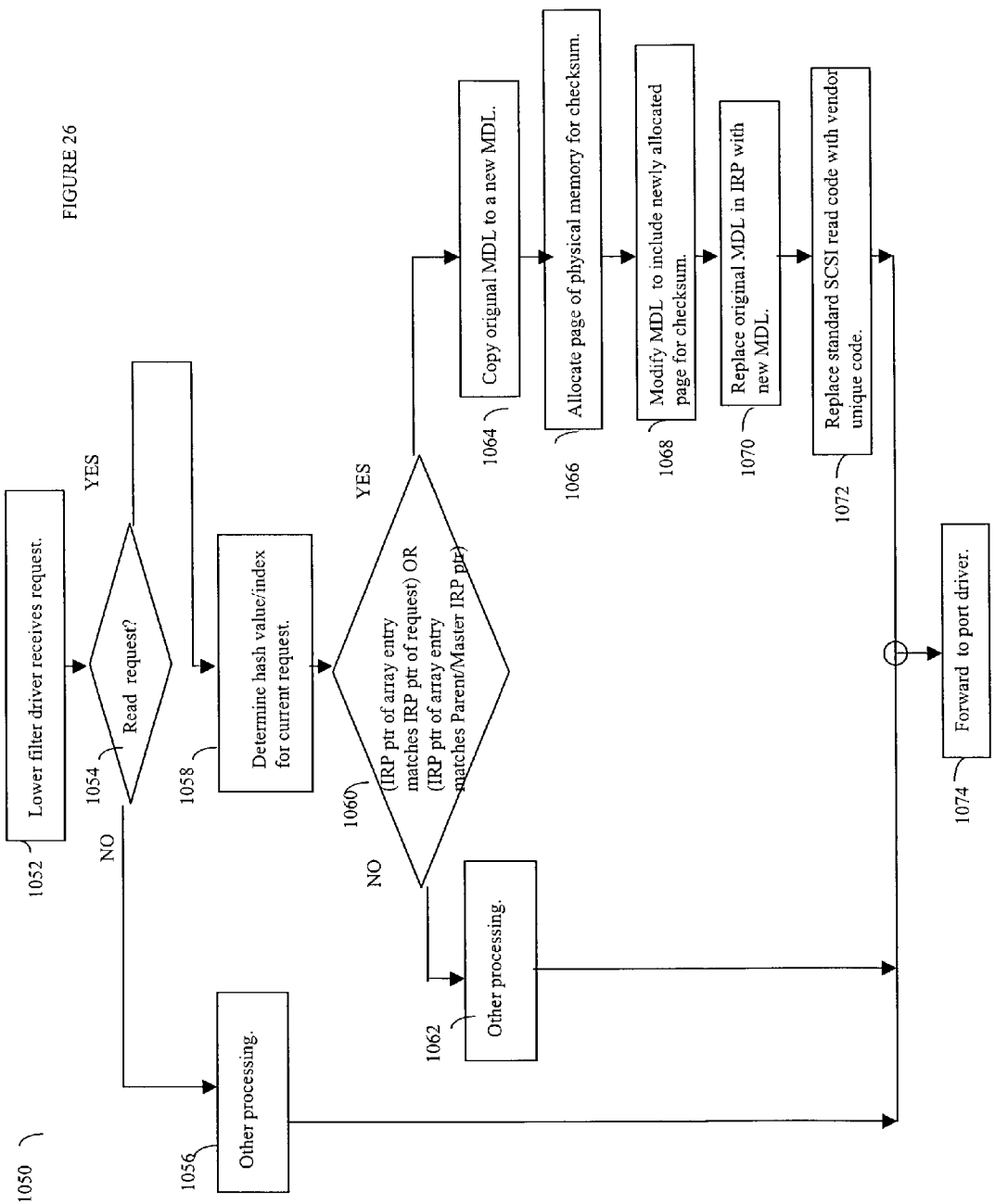
FIGS. 26–27 are flowcharts of processing steps of an embodiment of a method that may be performed by the lower filter driver.

Referring now to FIG. 26, shown is an example of an embodiment of a flowchart of steps of one embodiment that may be performed by the lower filter driver. It should be noted that processing steps of flowchart 1050 summarize those described herein. At step 1052, the lower filter driver receives the request being passed down the NT I/O stack. At step 1054, a determination is made as to whether this is a read request. If it is determined that this is not a read request, control proceeds to step 1056 for other processing. At step 1054, if a determination is made that this is a read request, control proceeds to step 1058 where a hash value or index is determined in accordance with the current I/O request. At step 1060, a determination is made as to whether the IRP pointer of the array entry for the hash value or index determined at step 1058 matches the IRP pointer of the incoming request. Additionally, it is also determined if the IRP pointer of the array entry corresponding to the hash or value or index determined at step 1058 matches the parent or master IRP pointer of the request just received. If neither of these conditions are true, control proceeds to step 1062 for other processing. Alternatively at step 1060 if either one of these conditions are true, control proceeds to step 1064 where the original MDL is copied to a new MDL. At step 1066, an additional page of physical memory is allocated to hold the checksum to be received from the data storage system in connection with the read request. At step 1068, the new MDL is modified to include the newly allocated page for the check sum. At step 1070, the original MDL is replaced with a new MDL allocated and modified at step 1068. At step 1072, the standard SCSI read code is replaced with a vendor unique code. It should be noted that step 1072 uses a technique described elsewhere herein such as in the processing of step 508 for the write command of FIG. 14 where a vendor unique function code is used to instruct the data storage system to perform additional processing in connection with checksum validation. In connection with the read vendor-defined code, the checksum value is returned in addition to the requested data. Subsequent to the processing of steps 1056, 1062 and 1072, control proceeds to step 1074 where the I/O request is passed from the lower filter driver to the port driver.

It should be noted that in the event that the child request being processed refers to the last portion of an original MDL or to an original request that is not fragmented by the file system, the newly allocated MDL is actually larger than the original MDL since the MDL includes an additional portion for the checksum value following the last portion of the original MDL.

Figure 27:
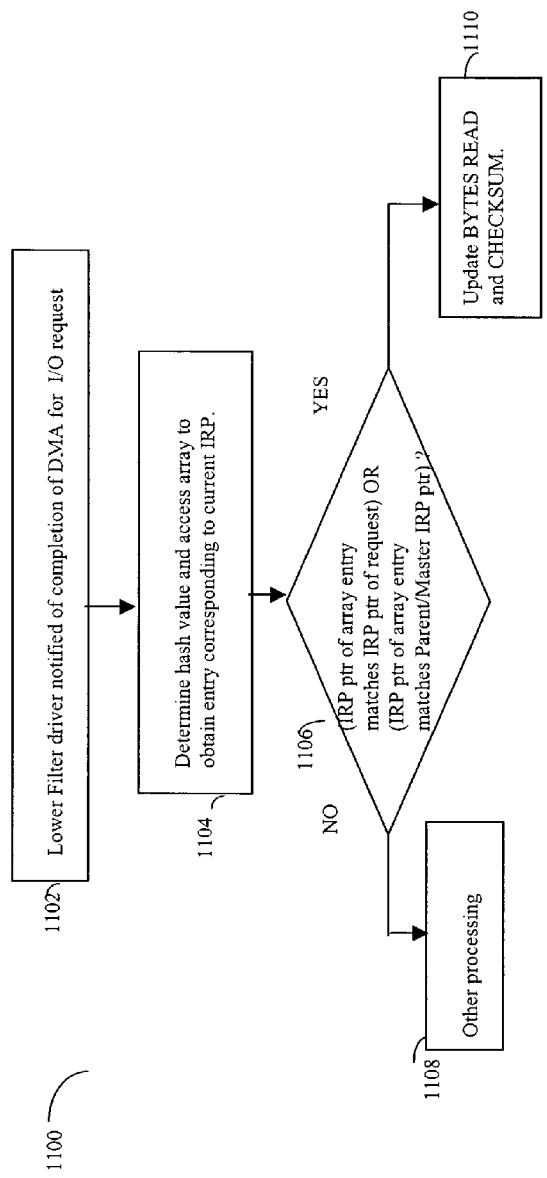

Referring now to FIG. 27, shown is the flowchart 1100 of steps of one embodiment that may be performed by the lower filter driver completion routine. At step 1102, the lower filter driver is notified as to the completion of the DMA for an I/O request. Control proceeds to step 1104 where the hash value is determined for the I/O request. Access to the shared array and the corresponding entry for the current IRP associated with the incoming I/O requests are obtained. Control proceeds to step 1106 where a determination is made as to whether the I/O request just serviced by the DMA is either an original IRP request or a child of a parent or master IRP. If it is determined at step 1106 that neither of these conditions are true, control proceeds to step 1108 where other processing may be performed. This other processing at step 1108 may include, for example, error processing. Otherwise, at step 1106, if it has been determined that the incoming IRP is either an original request or a child of a parent or master IRP in accordance with the shared array, control proceeds to step 1110 where the corresponding fields indicating the number of bytes read and the checksum value are accordingly updated. The bytes read field is updated to include the byte count for the I/O request just serviced. The checksum is updated to include cumulative or intermediate value reflecting the data of the current request received at step 1102.

It should be noted that the array described herein is a resource that may be shared by multiple threads running in a single or multi-processor system. All accesses to the array in connection with processing steps such as those of flowchart 1100, for both read and write, also include the steps for maintaining proper synchronization and access to the shared resource, for example using spinlocks. The steps for synchronizing access may vary in accordance with the type of access required (read or write), whether there are others currently accessing the shared resource, and the type of access (read or write) of the others currently accessing the shared resource.

It should be noted that as described elsewhere herein, a checksum may be formed from a plurality of checksums by performing a logical exclusive OR (XOR) operation as described in connection with processing of a fragmented or segmented write request. When all of the child IRPs have been serviced, the final checksum value will reflect the checksum of all of the data collectively received for the child IRPs. At any point in time, the checksum value may be characterized as an intermediate checksum value corresponding to all data associated with child requests received at a particular point in time.

In connection with performing the hashing as described in connection with the read processing, techniques similar to those described in connection with the write processing may be used, for example, in connection with a hash clash or collision where two IRP pointers map to the same entry within the shared array. Additionally, it should be noted that the need to control access to the shared array at different points in time may vary in accordance with the number of reader or writers included in a computer system.

As described herein, the lower filter driver and the upper filter driver may communicate using any of a variety of different techniques. For example, application programming interfaces (APIs) may be provided to read and/or write data to the shared data structure.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method for detecting a data error associated with a data operation comprising:

issuing a request, by an issuing host, for a data operation in connection with a device;

determining if said data operation is a read operation having checksumming enabled for a file associated with said read operation;

forming a data packet that includes a data command requesting data to be read and a checksum value for said data;

receiving said data packet at a target location on a data storage system; and sending a single return data packet including said data and said checksum value from said data storage system to said issuing host.

2. The method of claim 1, further comprising:

performing checksum data validation at said issuing host; and performing an appropriate action in accordance with said performing checksum data validation.

3. The method of claim 2, further comprising:

upon determining a checksum validation error, notifying an application on said issuing host that issued said request.

4. The method of claim 3, further comprising:

issuing another read operation upon receiving notification of said checksum validation error.

5. The method of claim 1, wherein a plurality of drivers are used in forming said data packet on said issuing host, and the method further comprises:

recording, using a first filter driver, request information in accordance with said read operation associated with a file having checksumming enabled.

6. The method of claim 5, further comprising:

determining, by a second filter driver using said request information, if a received request is for a read operation associated with a file having checksumming enabled; and if said received request is for a read operation associated with a file having checksumming enabled, forming a data packet to include a special function code indicating that a checksum is to be returned in a single return packet from a data storage system, said single return packet including data associated with said read operation and said checksum.

7. The method of claim 6, wherein said second filter driver replaces a standard read command with a vendor-defined read command.

8. The method of claim 7, wherein said standard read command and said vendor-defined read command are in accordance with a predefined standard.

9. The method of claim 8, wherein a file system driver receives said request from said first filter driver, said file system driver being positioned between said first filter driver and said second filter driver in an input/output stack in said issuing host.

10. The method of claim 9, wherein said request is an original data request and the method further comprising:
issuing, by said file system driver, a plurality of child data requests corresponding to said original data request.

11. The method of claim 10, wherein said checksum validation is performed by said first filter driver upon completion of one of: all child data requests associated with an original data request and said original data request if said original data request has no associated child data requests.

12. The method of claim 5, wherein said plurality of drivers are included in an input/output stack executing in kernel mode in an operating system.

13. The method of claim 12, wherein said input/output stack also includes a data request manager executing in kernel mode that communicates with an application issuing said request for performing a read operation.

14. A method for detecting a data error associated with a data operation comprising:
issuing a request, by an issuing host, for a data operation in connection with a device;
determining if said data operation is a read operation having checksumming enabled for a file associated with said read operation;
forming a data packet that includes a data command requesting data to be read and a checksum value for said data;
receiving said data packet at a target location;
sending a single return data packet including said data and said checksum value to said issuing host, wherein a plurality of drivers are used in forming said data packet on said issuing host;
recording, using a first filter driver, request information in accordance with said read operation associated with a file having checksumming enabled;
determining, by a second filter driver using said request information, if a received request is for a read operation associated with a file having checksumming enabled;
if said received request is for a read operation associated with a file having checksumming enabled, forming a data packet to include a special function code indicating that a checksum is to be returned in a single return packet from a data storage system, said single return packet including data associated with said read operation and said checksum, wherein said second filter driver replaces a standard read command with a vendor-defined read command, and said standard read command and said vendor-defined read command are in accordance with a predefined standard, and wherein a file system driver receives said request from said first filter driver, said file system driver being positioned between said first filter driver and said second filter driver in an input/output stack in said issuing host, said request is an original data request;
issuing, by said file system driver, a plurality of child data requests corresponding to said original data request; and
wherein a request received by said second filter driver includes a first memory descriptor list of physical memory locations associated with said request, and wherein the method further comprises said second filter driver, performing, upon determining that said request is for a read operation associated with a file having checksumming enabled:
creating a second memory descriptor list and copying said first memory descriptor list to said second memory descriptor list;
allocating an additional portion of physical memory for holding a checksum value associated with said read operation;
modifying said second memory descriptor list to include said additional portion for said checksum value; and
including said second memory descriptor list in said request rather than said first memory descriptor list.

15. The method of claim 14, further comprising:
receiving by a data storage system said request;
forming a return data request including data and an associated checksum value; and
sending said return data request to said issuing host.

16. The method of claim 15, further comprising:
said second filter driver receiving a return data request including a checksum value and data for a read operation request associated with a data file having checksumming enabled; and
updating said request information to indicate a cumulative checksum in accordance with an amount of data received in connection with an original data request.

17. A computer program product comprising machine executable code on a computer readable medium that detects a data error associated with a data operation, the computer readable medium comprising:
machine executable code that issues a request, by an issuing host, for a data operation in connection with a device;
machine executable code that determines if said data operation is a read operation having checksumming enabled for a file associated with said read operation;
machine executable code that forms a data packet that includes a data command requesting data to be read and a checksum value for said data;
machine executable code that receives said data packet at a target location on a data storage system; and
machine executable code that sends a single return data packet including said data and said checksum value from said data storage system to said issuing host.

18. The computer program product of claim 17, further comprising machine executable that:
performs checksum data validation at said issuing host; and
performs an appropriate action in accordance with said performing checksum data validation.

19. The computer program product of claim 18, further comprising:
machine executable code that, upon determining a checksum validation error, notifies an application on said issuing host that issued said request.

20. The computer program product of claim 19, further comprising:
machine executable code that issues another read operation upon receiving notification of said checksum validation error.

21. The computer program product of claim 17, wherein a plurality of drivers are used in forming said data packet on said issuing host, and the computer program product further comprises:
machine executable code that records, using a first filter driver, request information in accordance with said read operation associated with a file having checksumming enabled.

22. The computer program product of claim 21, further comprising:
  machine executable code that determines, by a second filter driver using said request information, if a received request is for a read operation associated with a file having checksumming enabled; and
  machine executable code that, if said received request is for a read operation associated with a file having checksumming enabled, forms a data packet to include a special function code indicating that a checksum is to be returned in a single return packet from a data storage system, said single return packet including data associated with said read operation and said checksum.

23. The computer program product of claim 22, wherein said second filter driver replaces a standard read command with a vendor-defined read command.

24. The computer program product of claim 23, wherein said standard read command and said vendor-defined read command are in accordance with a predefined standard.

25. The computer program product of claim 24, wherein a file system driver receives said request from said first filter driver, said file system driver being positioned between said first filter driver and said second filter driver in an input/output stack in said issuing host.

26. The computer program product of claim 25, wherein said request is an original data request and the computer program product further comprising:
  machine executable code that issues, by said file system driver, a plurality of child data requests corresponding to said original data request.

27. The computer program product of claim 26, wherein said checksum validation is performed by said first filter driver upon completion of one of: all child data requests associated with an original data request and said original data request if said original data request has no associated child data requests.

28. The computer program product of claim 21, wherein said plurality of drivers are included in an input/output stack executing in kernel mode in an operating system.

29. The computer program product of claim 28, wherein said input/output stack also includes a data request manager executing in kernel mode that communicates with an application issuing said request for performing a read operation.

30. A computer program product comprising machine executable code on a computer readable medium that detects a data error associated with a data operation, the computer readable medium comprising:
  machine executable code that issues a request, by an issuing host, for a data operation in connection with a device;
  machine executable code that determines if said data operation is a read operation having checksumming enabled for a file associated with said read operation;
  machine executable code that forms a data packet that includes a data command requesting data to be read and a checksum value for said data;
  machine executable code that receives said data packet at a target location;
  machine executable code that sends a single return data packet including said data and said checksum value to said issuing host, wherein a plurality of drivers are used in forming said data packet on said issuing host;
  machine executable code that records, using a first filter driver, request information in accordance with said read operation associated with a file having checksumming enabled;
  machine executable code that determines, by a second filter driver using said request information, if a received request is for a read operation associated with a file having checksumming enabled;
  machine executable code that, if said received request is for a read operation associated with a file having checksumming enabled, forms a data packet to include a special function code indicating that a checksum is to be returned in a single return packet from a data storage system, said single return packet including data associated with said read operation and said checksum, wherein said second filter driver replaces a standard read command with a vendor-defined read command, said standard read command and said vendor-defined read command are in accordance with a predefined standard, a file system driver receives said request from said first filter driver, said file system driver being positioned between said first filter driver and said second filter driver in an input/output stack in said issuing host, said request is an original data request;
  machine executable code that issues, by said file system driver, a plurality of child data requests corresponding to said original data request; and
  wherein a request received by said second filter driver includes a first memory descriptor list of physical memory locations associated with said request, and wherein the computer program product further comprises machine executable code causing said second filter driver to perform, upon determining that said request is for a read operation associated with a file having checksumming enabled:
  creating a second memory descriptor list and copying said first memory descriptor list to said second memory descriptor list;
  allocating an additional portion of physical memory for holding a checksum value associated with said read operation;
  modifying said second memory descriptor list to include said additional portion for said checksum value; and
  including said second memory descriptor list in said request rather than said first memory descriptor list.

31. The computer program product of claim 30, further comprising:
  machine executable that receives by a data storage system said request;
  machine executable code that returns a data request including data and an associated checksum value; and
  machine executable code that sends said return data request to said issuing host.

32. The computer program product of claim 31, further comprising:
  machine executable code causing said second filter driver to receive a return data request including a checksum value and data for a read operation request associated with a data file having checksumming enabled; and
  machine executable code that updates said request information to indicate a cumulative checksum in accordance with an amount of data received in connection with an original data request.

* * * * *